United States Patent [19]
Uchiyama et al.

[11] Patent Number: 5,943,516
[45] Date of Patent: Aug. 24, 1999

[54] CAMERA WITH A WARNING SYSTEM OF INAPPROPRIATE CAMERA HOLDING

[75] Inventors: Hiroyuki Uchiyama; Takashi Kubo; Masaaki Nomura; Muneyoshi Sato; Minoru Ishiguro; Minoru Takahashi, all of Saitama, Japan

[73] Assignees: Fuji Photo Film Co., Ltd., Kanagawa, Japan; Fuji Photo Optical Co., Ltd., Saitama, Japan

[21] Appl. No.: 08/843,488

[22] Filed: Apr. 16, 1997

Related U.S. Application Data

[63] Continuation of application No. 08/381,445, Jan. 31, 1995, abandoned.

[30] Foreign Application Priority Data

Jan. 31, 1994 [JP] Japan .................................. 6-010064
May 13, 1994 [JP] Japan .................................. 6-100170

[51] Int. Cl.$^6$ .............................. G03B 7/02; G03B 17/18
[52] U.S. Cl. .......................................................... 396/281
[58] Field of Search .................................. 396/281, 283, 396/373, 503

[56] References Cited

U.S. PATENT DOCUMENTS

| | | | |
|---|---|---|---|
| 4,136,291 | 1/1979 | Waldron | 307/308 |
| 4,206,990 | 6/1980 | Imura et al. | 354/195 |
| 4,329,039 | 5/1982 | Kaneko | 354/266 |
| 4,371,245 | 2/1983 | Iwata et al. | 354/198 |
| 4,538,894 | 9/1985 | Shirane | 354/467 |
| 4,547,054 | 10/1985 | Bridges | 354/268 |
| 4,589,519 | 5/1986 | Gruodis | 323/245 |
| 5,153,572 | 10/1992 | Caldwell | 340/712 |
| 5,189,417 | 2/1993 | Caldwell et al. | 341/26 |
| 5,210,560 | 5/1993 | Labaziewicz | 354/268 |
| 5,572,205 | 11/1996 | Caldwell et al. | 341/33 |

*Primary Examiner*—Safet Metjahic
*Assistant Examiner*—Christopher E. Mahoney
*Attorney, Agent, or Firm*—Young & Thompson

[57] ABSTRACT

A warning system of a camera for providing a photographer a warning indicating an impediment to a window, provided in a front wall of the camera, through which light traveling toward and/or from a subject passes. It includes a touch sensor, disposed in close proximity to the window, which involves a resistance, or a body capacity, of a photographer's finger touching the sensor in, and as a part of, an electric circuit. This provides a change in electric parameter of the circuit by which a warning device is actuated to emit light, or otherwise generate sound, as the warning of impediment.

10 Claims, 20 Drawing Sheets

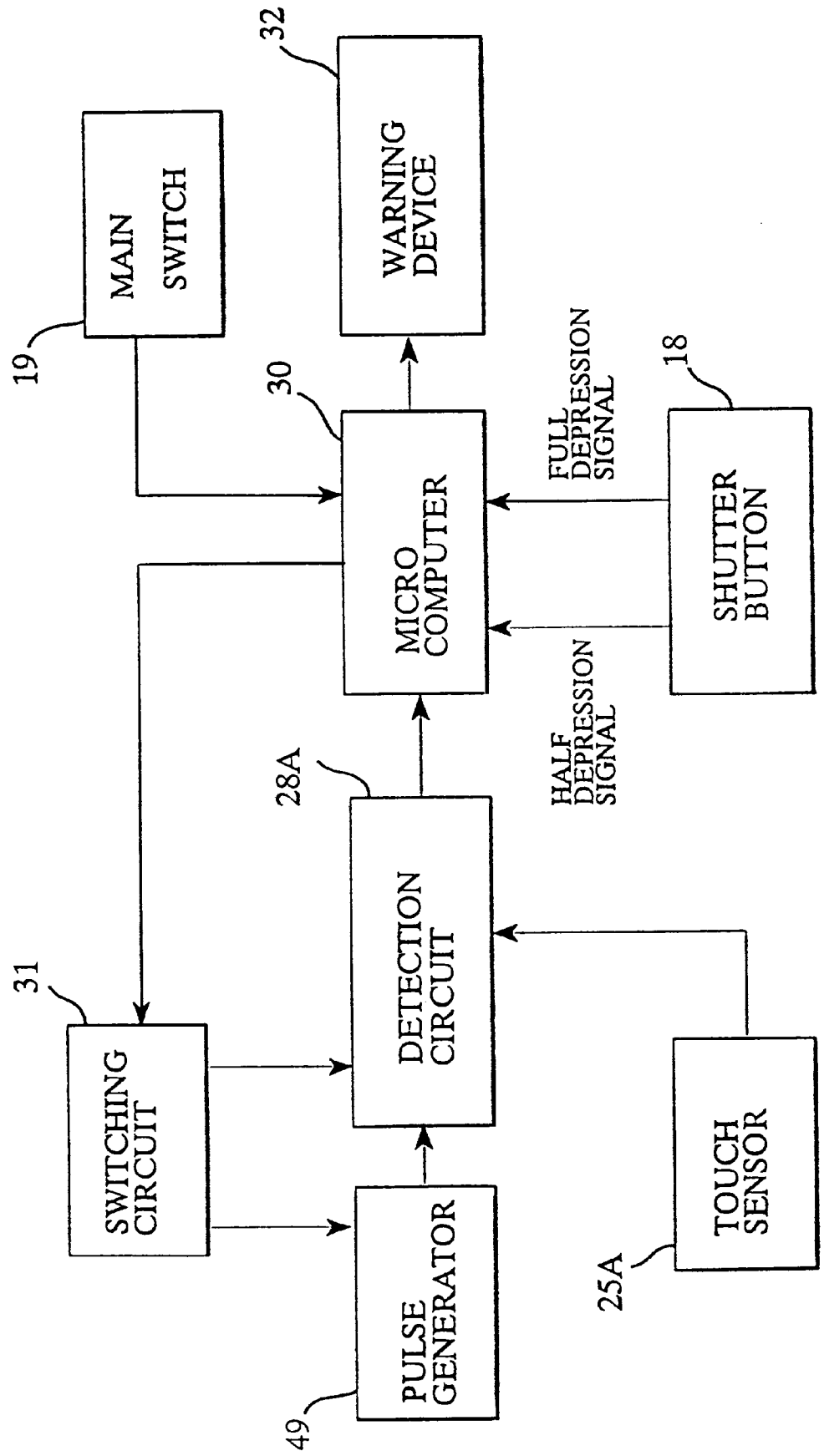

FIG. 17
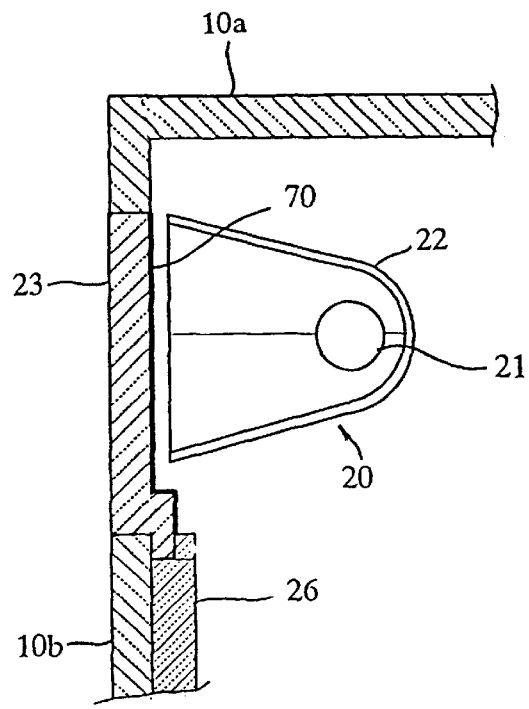
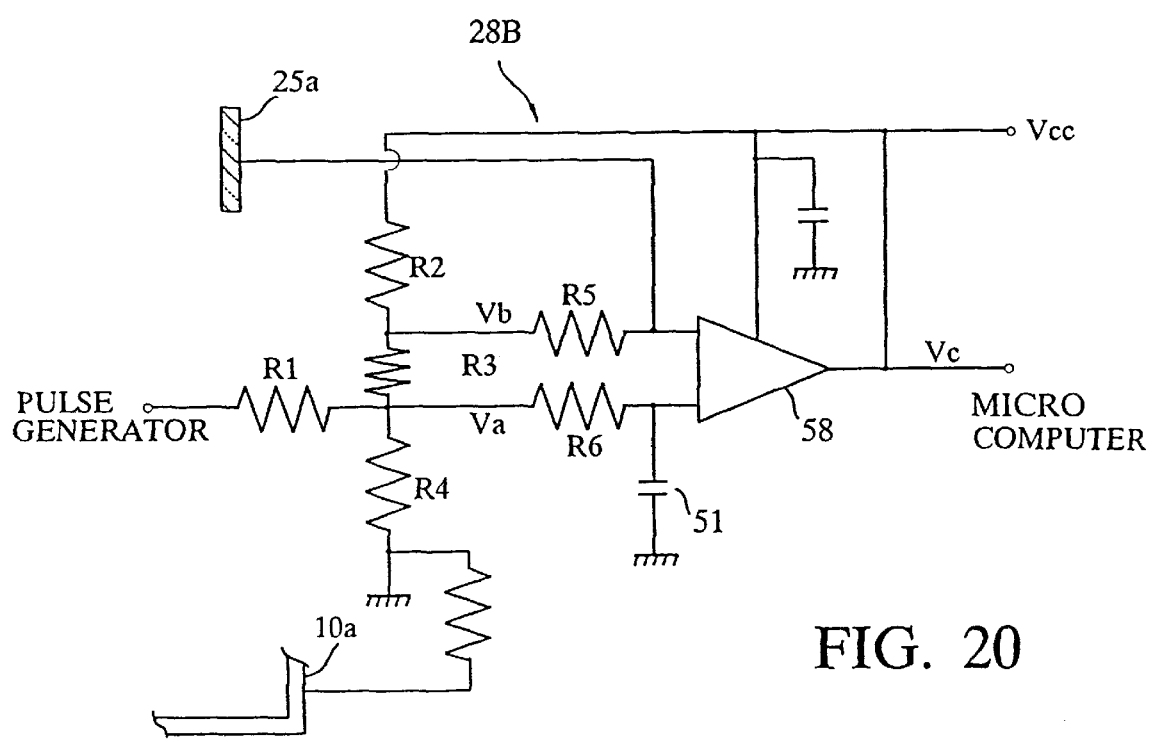
FIG. 20

CAMERA WITH A WARNING SYSTEM OF INAPPROPRIATE CAMERA HOLDING

This application is a continuation of application Ser. No. 08/381,445, filed Jan. 31, 1995, now abandoned.

BACKGROUND OF THE INVENTION

1. Field of the Invention

The present invention relates to a photographic camera, and, more particularly, to a photographic camera with a feature of letting a photographer perceive improper camera holding that results in unsuccessful picture shooting.

2. Description of Related Art

Typically, modern compact photographic cameras for use with, in particular, 135 format films incorporate various automatic features, such as automatic focusing, automatic exposure control, automatic firing of built-in electronic flashes, etc. which allow even beginners to take successful pictures. While, such a full-automatic photographic camera is easy to use, it is neither always infallible nor secures successful results. One of the most frequent causes of unsuccessful pictures taken by the automatic photographic camera is a partial or entire interception of light from and/or toward a subject traveling through a window of, for instance, an automatic exposure control system, an automatic focusing system or a built-in electronic flash, with a photographer's finger 67 or fingers 67. For instance, as illustrated in FIG. 28, if a photographer's finger 67 impedes or covers at least partly a window glass 17 of a built-in electronic flash of a photographic camera 10 held by both hands during photographing, the electronic flash with the window thus covered does not provide a uniform distribution of flash light on an aimed subject, resulting in a printed picture partly underexposed. If a window that is partly or entirely impeded or covered by a photographer's finger 67 during photographing is either one or both of windows 12 and 14 of an active type of automatic focusing system, a precise focusing is not achieved. Further, if a window 9 of an automatic exposure control system behind which a photoelectric cell (not shown) is disposed is partially impeded or covered by a photographer's finger during photographing, a correct exposure is not achieved. Attention has been given to various structural approaches relating to eliminating such mis-photographing, and various efforts have been made to prevent inadvertent coverage of a flash window of an electronic flash built-in the camera in order to improve utilization of the automatic compact camera.

One such effort is that described in Japanese Unexamined Utility Model Publication No. 61-129 or Japanese Unexamined Patent Publication No. 5-188437. The approach used was to form fine dents or projection on a camera body around the flash window so as to let the photographer perceive, through a feeling of touch, that the photographer's finger is placed in close proximity to the flash window and, consequently, that the finger must be moved. Alternatively, an obstacle is formed so as to prevent the photographer's finger from being placed on, or in close proximity to, the flash window.

While these structures as described in the publications may have advantageous over the prior art, nevertheless, various constraints must be imposed upon outer camera appearances and/or the compactness of photographic cameras. In addition, because these dents and projections, or an obstacle, of such a photographic camera do not always give photographers a distinct perception of improper camera holding, the photographer sometimes unintentionally disregards a partial impediment of the flash window with the photographer's finger, resulting in an unsuccessful picture.

Various kinds of sensors that detects contact of a human body thereto are well known from, for instance, Japanese Unexamined Patent Publications Nos. 50-66774, 59-218181 and 4-25219. However, these sensors include complicated circuits and are not suitable for pragmatic application to compact photographic cameras.

SUMMARY OF THE INVENTION

It is an object of the present invention to provide a photographic camera with a feature of providing for a photographer a clearly perceivable warning of an impediment of a lighting window through which light traveling from or toward a subject passes.

The above object of the present invention is achieved by providing a photographic camera with a warning system for providing a warning indicating that a finger of a photographer impedes at least partially a window of, for instance, an automatic focusing system, an automatic exposure control system, or a built-in electronic flash, provided in a front wall of the photographic camera, through which light traveling toward and/or from a subject passes. The warning system includes a touch sensor disposed in close proximity to the window so as to be touched by a photographer's finger when the photographer's finger impedes at least partly the window and an electric circuit, disposed inside the camera body and electrically connected to the touch sensor, for involving a photographer's finger in, and as a part of, the electric circuit when the touch sensor is touched by the photographer's finger so as to provide a change in an electric parameter of the circuit when the touch sensor is touched by the photographer's finger. This electric circuit actuates a warning device including, for instance a light emitting element or a sound generating element, when the electric parameter changes so as to let the photographer perceive a warning of the impediment of the window by the photographer's finger.

Specifically, the electric circuit may detect a resistance, as the electrical parameter, which changes from infinite when the touch sensor is not touched by the photographer's finger to finite when the touch sensor is touched by the photographer's finger, the change in resistance may be detected in the form of a current, which depends upon the finite resistance, across the electric circuit. The touch sensor is comprised of a pair of electrically conductive segments, disposed in parallel with each other and along at least bottom and outer sides of the window, which are electrically isolated from each other and the camera body so as to provide an in favor of infinite resistance for the electric circuit, and which are brought into electrical connection by being touched by the photographer's finger so as to cause a change in resistance from infinite to finite.

With the camera, if a photographer holds the camera with his or her finger placed in close proximity to or impeding at least partly the window, the touch sensor involves the finger in, and as a part of, the electric circuit so as to detect a resistance of the finger and actuate the warning device to generate sound or emit light, thereby letting a photographer perceive improper camera holding.

Alternatively, the electric circuit may detect an electrostatic capacity, as the electric parameter, which changes due to an electrostatic body capacity of a photographer's finger involved in the electric circuit when the touch sensor is touched by the photographer's finger. The touch sensor is comprised a single electrically conductive segment electrically isolated from the camera body and an insulation cover for covering and insulating the electrically conductive segment from the exterior of the camera body so as to impart an electrostatic body capacity of the photographer's finger to the electric circuit when the electrically conductive segment is touched by the photographer's finger through the insulation cover. The electric circuit includes a pulse generator for providing a high frequency pulse signal and a comparator for detecting a phase difference, as a change in electric parameter, between the high frequency pulse signal imparted, as a object signal, thereto through the touch sensor and the high frequency pulse signal imparted, as a reference signal, directly, or otherwise through a capacitor, thereto. When the comparator detects a phase difference, it causes an inversion of output which actuates the warning device. In place of the capacitor, electrically offsetting means, such as an electrically conductive segment, may be disposed inside the camera body and away from the electrically conductive segment of the touch sensor so as to be electrically isolated from the camera body and electrically connected to the comparator. The offsetting means involves an electrostatic body capacity of the photographer's finger in, and as a part of, the delay circuit through the photographic camera body held by the photographer. In this instance, the electrically offsetting means provides for the electric circuit an electrostatic capacity greater than the touch sensor when the camera body is free from the electrostatic body capacity of the photographer.

According to this embodiment, if a photographer holds the camera with his or her finger placed in proximity to or impeding at least partly the window, the touch sensor involves the finger in, and as a part of, the electric circuit so as to detect a electrostatic body capacity of the photographer and actuate the warning device to generate sound or emit light, thereby letting a photographer perceive improper camera holding. Furthermore, the provision of an offsetting conductive segment prevents the warning system from providing a warning when the camera body is held with the photographer's fingers near but not over the touch sensor.

BRIEF DESCRIPTION OF THE DRAWINGS

The above and other objects and features of the present invention will be clearly understood from the following description with respect to a preferred embodiment thereof when considered in conjunction with the accompanying drawings, wherein the same reference numerals have been used to denote the same or similar parts or elements throughout the drawings and in which:

FIG. 7 is a block diagram showing the window impediment warning system, of FIG. 6;

FIG. 17 is a cross-sectional view of an essential part of a photographic camera with a window impediment warning system in accordance with still another preferred embodiment of the present invention;

FIG. 20 is a diagram showing a phase difference detection circuit of the window impediment warning system of FIG. 18;

DETAILED DESCRIPTION OF THE PREFERRED EMBODIMENTS

Because photographic cameras with various types of automatic features are well known, the present description will be directed in particular to elements forming part of, or cooperating directly with, an apparatus in accordance with the present invention. It is to be understood that elements not specifically shown or described can take various forms well known to those skilled in the photographic art.

The term "lighting window" used herein shall mean and refer to an opening or windows through which light, travels toward an aimed subject from an automatic control system inside a photographic camera or vice versa.

Figure 1:
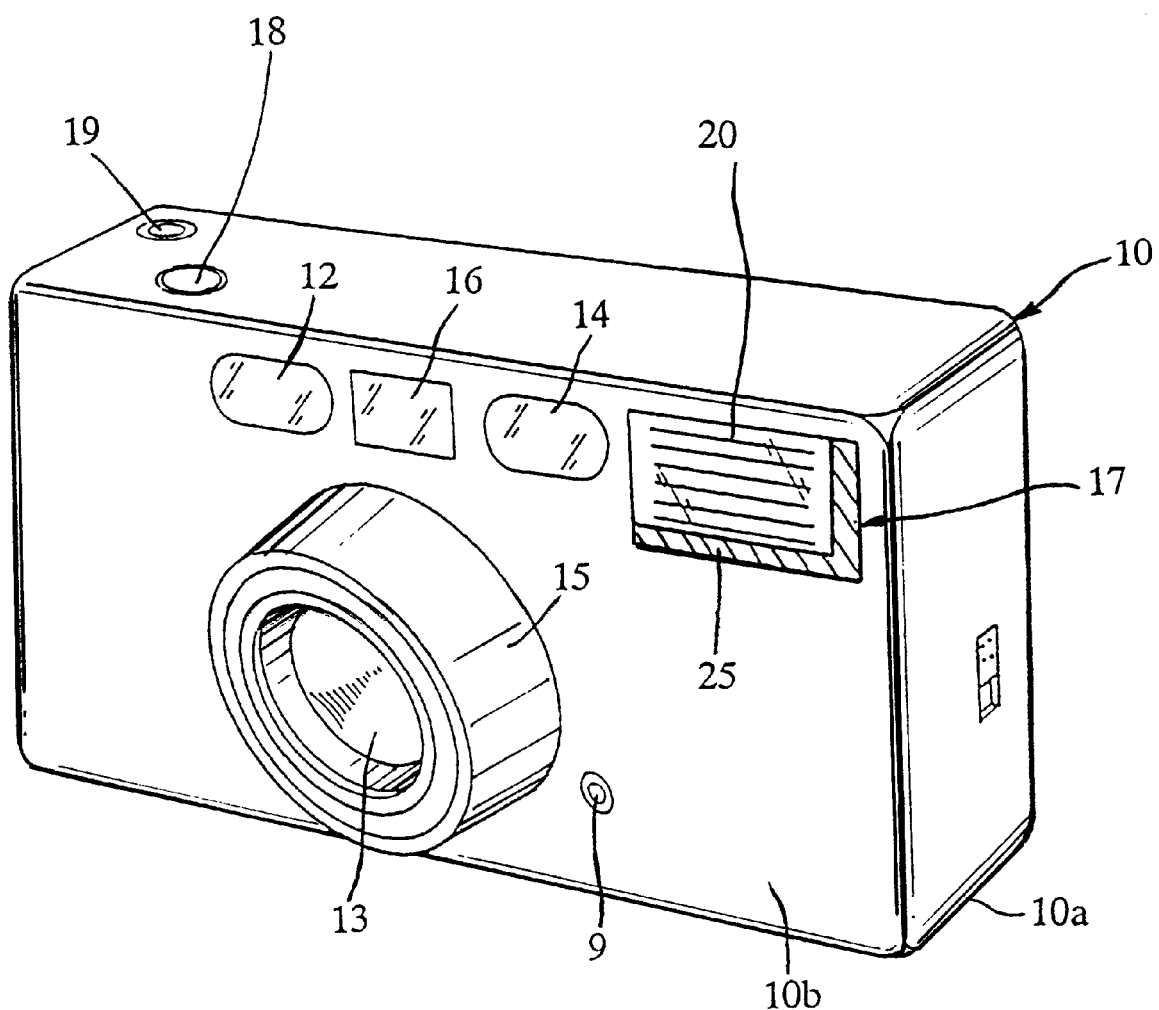
FIG. 1 is a schematic perspective view of a photographic camera with a window impediment warning system in accordance with a preferred embodiment of the present invention.

Referring now to the drawings in detail, and in particular, to FIG. 1, a compact photographic camera 10 incorporating various automatic features, for instance an active type of automatic focusing, an automatic exposure control system, and an built-in electronic flash, is shown. The camera 10 has a taking lens 13 held in a lens barrel 15 approximately at the center of a front wall 10b of the camera body 10a. Because the taking lens 13 directs incoming light to a film loaded in the camera, it is also referred to in this specification as a kind of light window. The active type automatic focusing system, which measures a distance to an aimed subject and focuses the taking lens 13 on the subject, includes a pair of lighting windows, namely an emanating light window 12 through which near infrared rays pass and are directed toward the aimed subject and an incoming light window 14 through which the reflected near infrared rays from the subject pass into the inside of the camera body 10a. A built-in electric flash unit 20 has a rectangular flash window 11 with a transparent diffusion plate 23 disposed adjacent to the incoming light window 14 of the active type automatic focusing system and automatically provides flash light so as to illuminate the subject. An automatic exposure control system meters light incoming onto a photoelectric cell through a window 9 so as to calculate the brightness of the subject based on which a shutter speed and/or an aperture size and, if necessary, use of the electronic flash are determined. The lighting windows 12 and 14 of the active type automatic focusing system are disposed just above the lens barrel 15 and separated at a predetermined distance from each other in a horizontal direction. All of the basic automatic features are well known to those skilled in the art and may take any well known type. The camera 10 further has a finder window 16 of a direct vision view finder disposed between the lighting windows 12 and 14, a shutter button 18 and a main power switch 19. The shutter release button 18 can be depressed in two steps, namely a first half depression for causing the measurement of subject brightness and subject distance and another half depression for shutter release. In this instance, when the shutter release button 18 is depressed halfway the automatic focusing system is instantaneously activated to focus the taking lens 13 on a targeted subject. When it is subsequently fully depressed, it releases a shutter to make an exposure. In addition, the camera body 10a is provided with a generally L-shaped touch sensor 25 extending along two adjacent sides of the rectangular flash window 11 forming part of an impediment warning system 17 which will be described in detail later.

Figure 2:
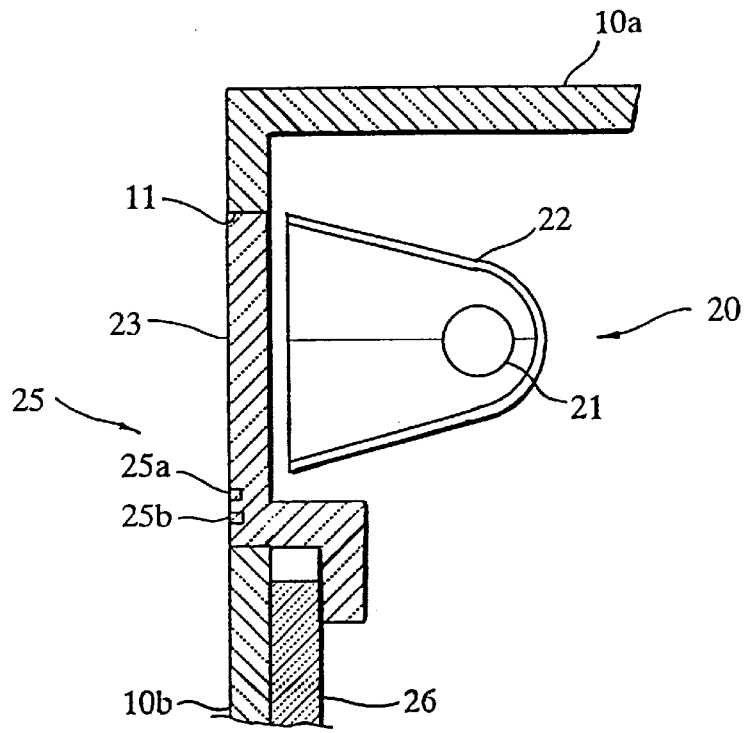
FIG. 2 is a cross-sectional view of an essential part of the camera of FIG. 1.

Referring to FIG. 2 showing a fixed flash head of the built-in automatic flash unit 20, there are disposed an elongated flash tube 21, such as a xenon tube, extending horizontally behind the flash window 11, a reflector 22 which reflects flash light so as to direct it forward and protects the xenon tube 21, and a non-conductive, transparent diffusion plate 23 fitted in the flash window 11. The transparent diffusion plate 23 has in its lower portion a touch sensor 25 formed by a pair of conductive strips 25a and 25b electrically separated from each other embedded in diffusion plate 23. These conductive strips 25a and 25b are disposed in parallel with each other with a small separation and flush with the transparent diffusion plate 23. Because the transparent diffusion plate 23 is non-conductive, the conductive strips 25a and 25b are insulated from each other. The touch sensor 25 is electrically connected to an impediment warning circuit of the impediment warning system 17 printed on a circuit board 26, disposed below the transparent diffusion plate 23 and secured to the backside of the front wall 10b of the camera body 10a, so as to detect that the touch sensor 25 is touched by a photographer's finger 67. This circuit board 26 may bear a flash control circuit as well.

Figure 3:
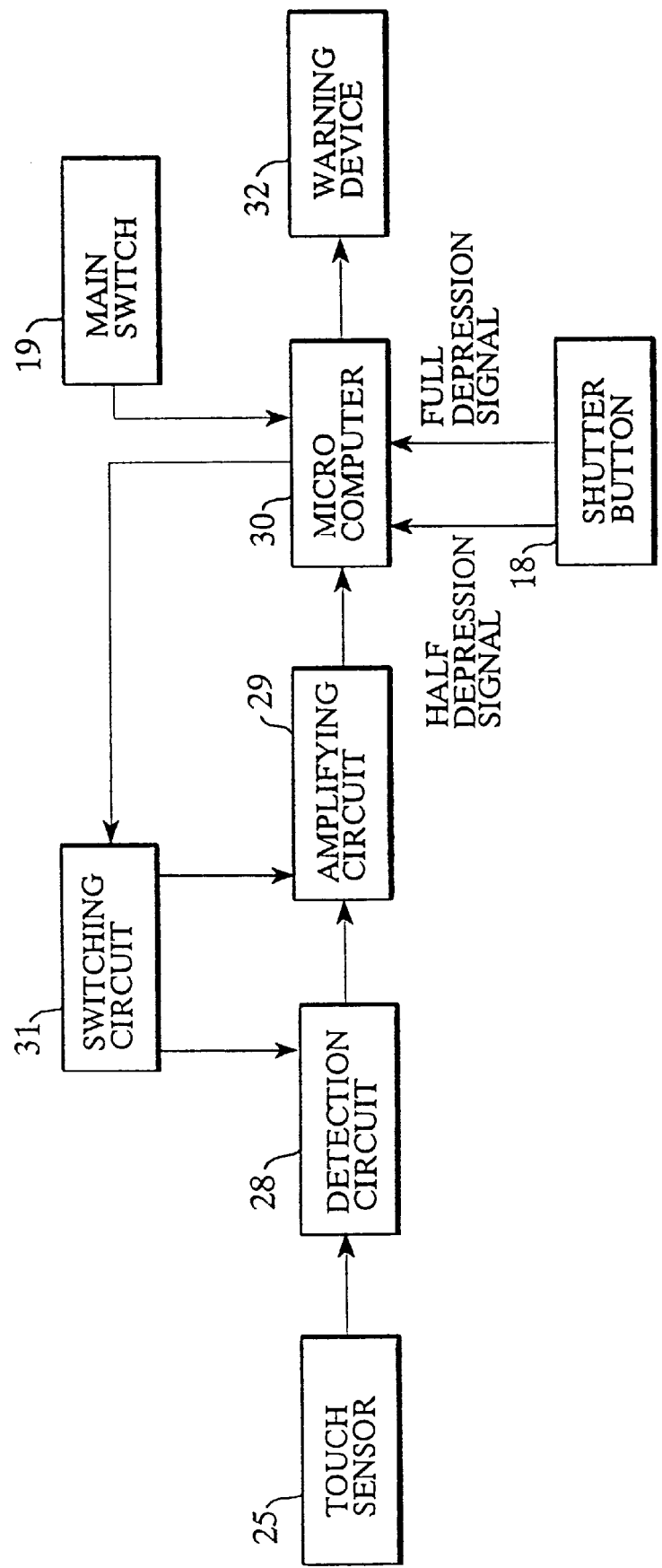
FIG. 3 is a block diagram showing the window impediment warning system.

Referring to FIG. 3 schematically showing the impediment warning system 17 in block diagram, the touch sensor 25 is connected to a detection circuit 28 for detecting a change in an electrical parameter, such as resistance, between the conductive strips 25a and 25b. As will be described in detail, the detection circuit 28 is structured so as to detect a current across it when the conductive strips 25a and 25b are electrically connected by any conductive material. If the touch sensor 25 is touched by a photographer's finger 67 which is made of conductive material, it involves the photographer's finger 67, which is one of conductive material having a finite low resistance, therein, so that there is provided a current across the detection circuit 28. On the other hand, if the touch sensor 25 is not touched and, accordingly, the conductive strips 25a and 25b are electrically isolated, i.e. they are connected by an infinitely large resistance, there is no current across the detection circuit 28. Accordingly, when the touch sensor 25 is touched by a photographer's finger 67 so as to electrically connect the conductive strips 25a and 25b, there occurs a change in resistance of the detection circuit 28 from infinite to finite, i.e. a current across the detection circuit 28. The current detected by the detection circuit 28 is amplified by an amplifier circuit 29. A microcomputer 30 actuates a warning device 32 to produce visible light or sound when the amplified current is at a predetermined level. This microcomputer 30 manages various camera operation controls including automatic focusing and automatic exposure control. These detection circuit 28 and amplifier circuit 29 are activated by means of a switching circuit 31 controlled by the microcomputer 30. Specifically, when the microcomputer 30 receives a signal indicative of a half depression of the shutter release button 18 for performing automatic focusing and automatic exposure control, it forces the switching circuit 31 to activate both current detection circuit 28 and amplifier circuit 29, simultaneously.

Figure 4:
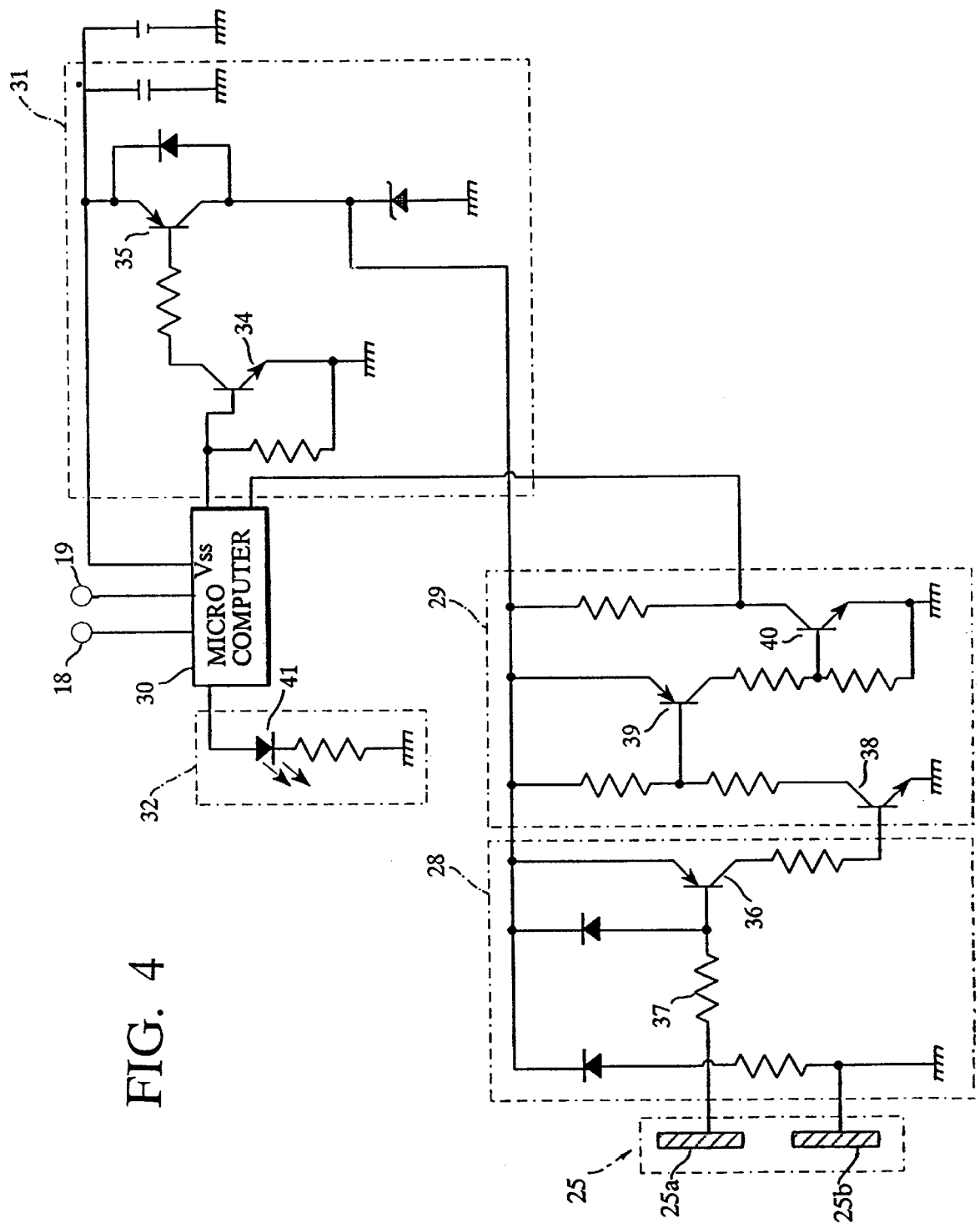
FIG. 4 is a circuit diagram of the window impediment warning system.

Referring to FIG. 4 showing a detailed impediment warning circuit of the impediment warning system 17, the switching circuit 31 includes two transistors 34 and 35 arranged such that the transistor 34 is turned conductive upon an occurrence of a base current, causing the transistor 35 to turn conductive as well. Consequently, both current detection circuit 28 and amplifier circuit 29 are supplied with a battery power so as to be activated. The microcomputer 30 provides a base current for the transistor 34 only when the automatic exposure control system determines that the brightness of a target subject is lower than the brightness predetermined for automatic flash photography. If the camera 10 is of a type having an automatic flash unit 20 fired for every exposure, the microcomputer 30 may otherwise provide the base current for turning the transistors 34 and 35 of the switching circuit 31 conductive when the main power switch 19 is turned on.

The current detection circuit 28 includes a transistor 36 with its base connected to the conductive strip 25a through a resistance 37 and its emitter connected to the conductive strip 25*a*. This transistor 36 turns conductive when a feeble current is supplied to the base through the resistance 37. Accordingly, when the conductive strips 25*a* and 25*b* are shorted, the transistor 36 turns conductive. Accordingly, when the touch sensor 25 is touched by a photographer's finger 67 as a resistance material, the conductive strips 25*a* and 26*b* are shorted so as to short-circuit the transistor circuit and thereby to provide a base current to the transistor 36, turning the transistor 36 conductive. In such a manner, the current detection circuit 28 detects by means of the change of the transistor 36 into the conductive state that the touch sensor 25 is in contact with a photographer's finger 67 or fingers 67.

The amplifier circuit 29 is comprised of three transistors 38–40 and a plurality of resistances which are arranged so as to turn conductive while the transistor 36 is conductive. Accordingly, the current across the transistor 36 is amplified by the amplifier circuit 29 and provided as an impediment detection signal and sent to the microcomputer 30. Upon the occurrence of an impediment detection signal, the microcomputer 30 activates the warning device 32 to produce visible light or sound for a warning. This warning device 32, disposed within the view finder behind the finder window 16, which may be comprised of, for instance, a light emitting diode (LED) 41 continuously emits visible light on and off, giving the photographer a warning that the flash window 11 is partially impeded by his or her finger 67 or fingers 67. If the warning device 32 is an artificial sound generating element, it may be disposed anywhere inside the camera body 10*a*.

Figure 5:
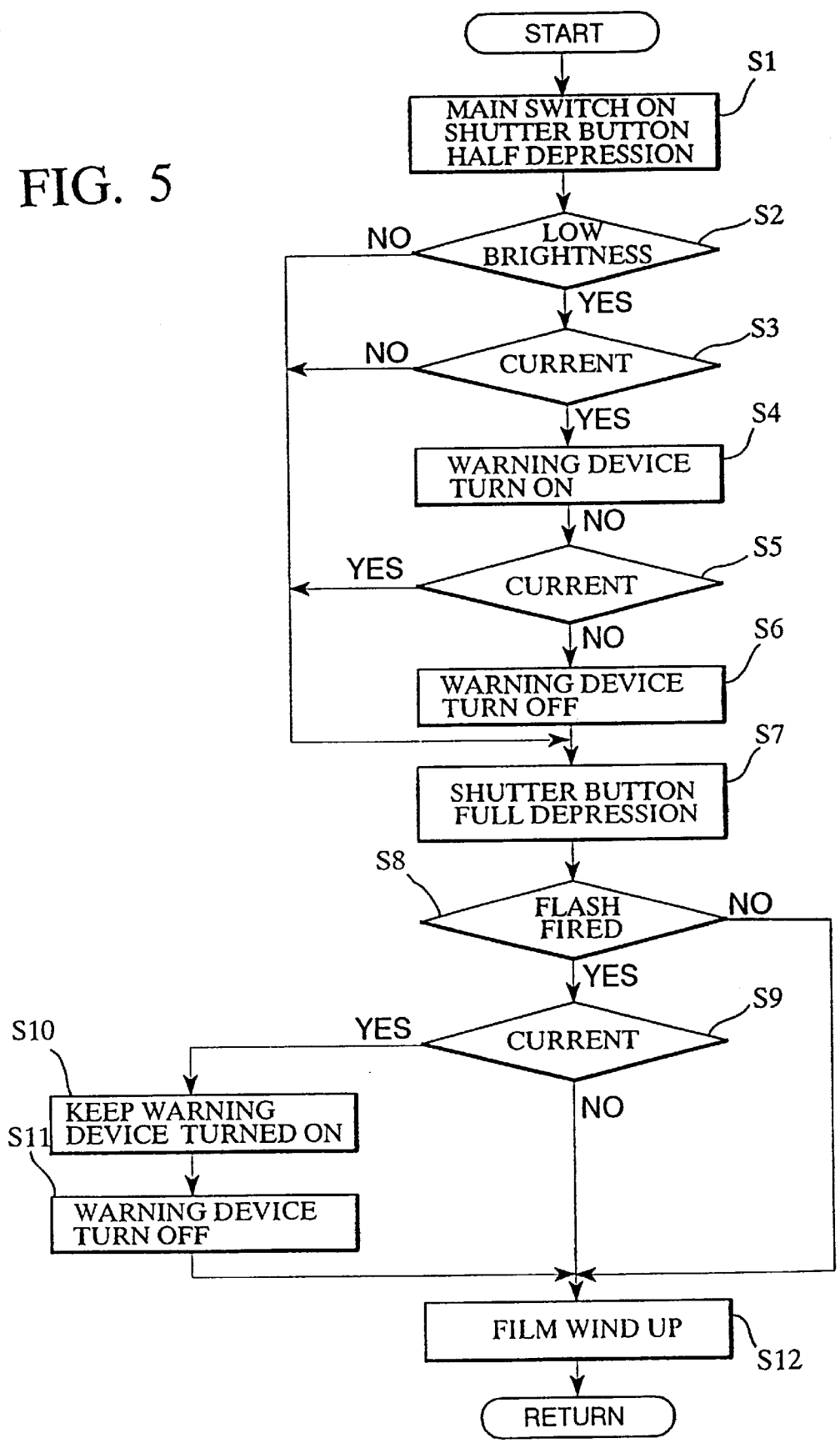
FIG. 5 is a flow chart illustrating a window impediment warning control.

The operation of the camera 10 with an impediment warning system 17 depicted in FIGS. 1–4 will be best understood by reviewing FIG. 5, which is a flow chart illustrating a routine for the microcomputer 30. Programming a computer is a skill well understood in the art. The following description is written to enable a programmer having ordinary skill in the art to prepare an appropriate program for the microcomputer. The particular details of any such program would of course depend upon the architecture of the particular computer selected.

In FIG. 5, after the main switch 19 has been turned on, when the shutter release button 18 is kept depressed halfway, the sequence routine commences and control directly proceeds to step S1 where the automatic focusing system projects near infrared light onto a target subject through the lighting window 12 and receives the reflected near infrared light from the targeted subject through the lighting window 14 so as to measure the subject distance and simultaneously, the automatic exposure control system receives light through the lighting window to measure the brightness of the target subject. The automatic focusing system automatically adjusts the taking lens 13 to focus on the targeted subject according to the subject distance. Simultaneously, the automatic exposure control system automatically adjusts shutter speed or aperture setting according to the metered subject brightness. Further, at this time, the microcomputer 30 receives a half depression signal and activates the switching circuit 28 and the amplifier circuit 29. Subsequently, a decision is made at step S2 as to whether the subject brightness is lower than the predetermined brightness, i.e. it is necessary to fire the electronic flash unit 20. If the answer to the decision is "YES," i.e. the subject brightness is lower than the predetermined brightness, then, after the electronic flash unit 20 is brought ready, a decision is further made at step S3 as to whether there is a feeble current across the current detection circuit 38. If the answer to the decision is "YES," this indicates that the touch sensor 25 is touched by a resistance material, such as a photographer's finger 67, and accordingly, the flash window 11 is possibly impeded by the photographer's finger 67, then, responding to the presence of an amplified current, the light emitting diode (LED) 41 is excited to emit visible light so as to provide an impediment warning for the photographer at step S4. This warning must cause the photographer to draw attention to his or her fingers 67 and, as a result, to shift his or her hold on the camera body 10*a*. Or to remove his or her finger 67 from the shutter release button 18. When the photographer keeps the shutter release button 18 still half depressed, a decision is made at step S5 as to whether there is still a feeble current across the current detection circuit 28. If the photographer is conscious that his or her finger 67 touches the touch sensor 25 and shifts his or her hold on the camera body 10*a* and removes or clears the finger 67 away from the touch sensor 25 with the shutter release button 18 kept half depressed, then, the answer to the decision is "NO," activating the light emitting diode (LED) 41 to turn off the impediment warning at step S6. The disappearance of the warning lets the photographer know that the camera is ready.

In this instance, even if the answer to the decision made at step S5 is "YES," in other words, the flash window 11 is still partially impeded by the photographer's finger 67, the camera 10 allows to make an exposure with the light emitting diode (LED) 41 left turned on. This is because, even under an impediment warning, it is sometimes necessary to permit shooting in order to avoid missing an instantaneous golden shooting chance. On the other hand, if the photographer discontinues the half depression of the shutter release button 18 and subsequently, depresses it half again, the same procedure take places through steps S1–S5.

On the other hand, if the answer to the decision made at any step S2 or S3 is "NO," no warning is given, letting the photographer know that the camera body 10*a* is appropriately held and shooting is ready.

Thereafter, when the shutter release button 18 is fully depressed and provides a full depression signal for the microcomputer 30 at step S7, a decision is made at step S8 as to whether the electronic flash unit 20 was fired. If the answer to the decision is "NO" because the subject brightness has been found to be sufficiently high at step S2, the camera 10 winds the film by one frame at step S13 and then, the sequence ends. However, if the answer is "YES," then, a final decision is made at step S9 as to whether there is still a feeble current across the current detection circuit 28, i.e. whether the touch sensor 25 is touched by the photographer's finger 67. If the answer to the decision is "NO," then, the camera 10 winds the film by one frame at step S13 and then, the sequence ends. However, if the answer to the decision is "YES," this indicates that an exposure has been intentionally made with the flash window 11 left impeded by the photogarpher's finger 67, then, after the light emitting diode 41 has been left excited for a predetermined period of time at step S10, it is turned off at step S11. Thereafter, the camera 10 winds the film by one frame and the sequence ends.

If it is always preferable to prevent unsuccessful pictures, the shutter release button 18 may be locked so as to be prevented from being fully depressed, thereby prohibiting an exposure when the "YES" answer is provided at step S5.

Figure 6:
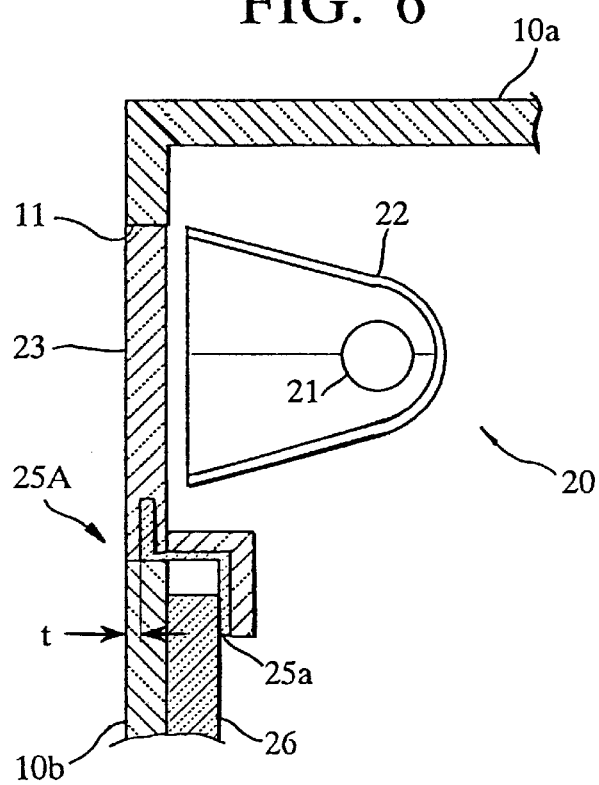
FIG. 6 is a cross-sectional view of an essential part of a photographic camera with a window impediment warning system in accordance with another preferred embodiment of the present invention.

Referring to FIG. 6, showing a compact photographic camera 10 with an impediment warning feature in accordance with another preferred embodiment of the present invention in which an electrostatic capacity detection type of touch sensor is used in place of the current detection type touch sensor 25 in the previous embodiment, a photographic camera body 10a is provided with an electrostatic capacity detection type touch sensor 25A forming part of an impediment warning system 17A which will be described in detail later. This touch sensor 25A comprises an elongated conductive member 25a extending along and in close proximity to a lower side of a rectangular flash window 11 and embedded in a transparent diffusion plate 23 made of polyethylene terephthalate (PET). This elongated conductive strip 25a is integrally formed with an L-shaped tail extension exposed outside the transparent diffusion plate 23. Below the transparent diffusion plate 23 and inside the camera body 10a, there is provided a circuit board 26, secured to the backside of a front wall of the camera body 10a, on which an impediment warning circuit of the impediment warning system 17A is printed. The conductive strip 25a of the touch sensor 25A is electrically connected to the impediment warning circuit of the impediment warning system 17A. This circuit board 26 may bear a flash control circuit as well.

Figure 8:
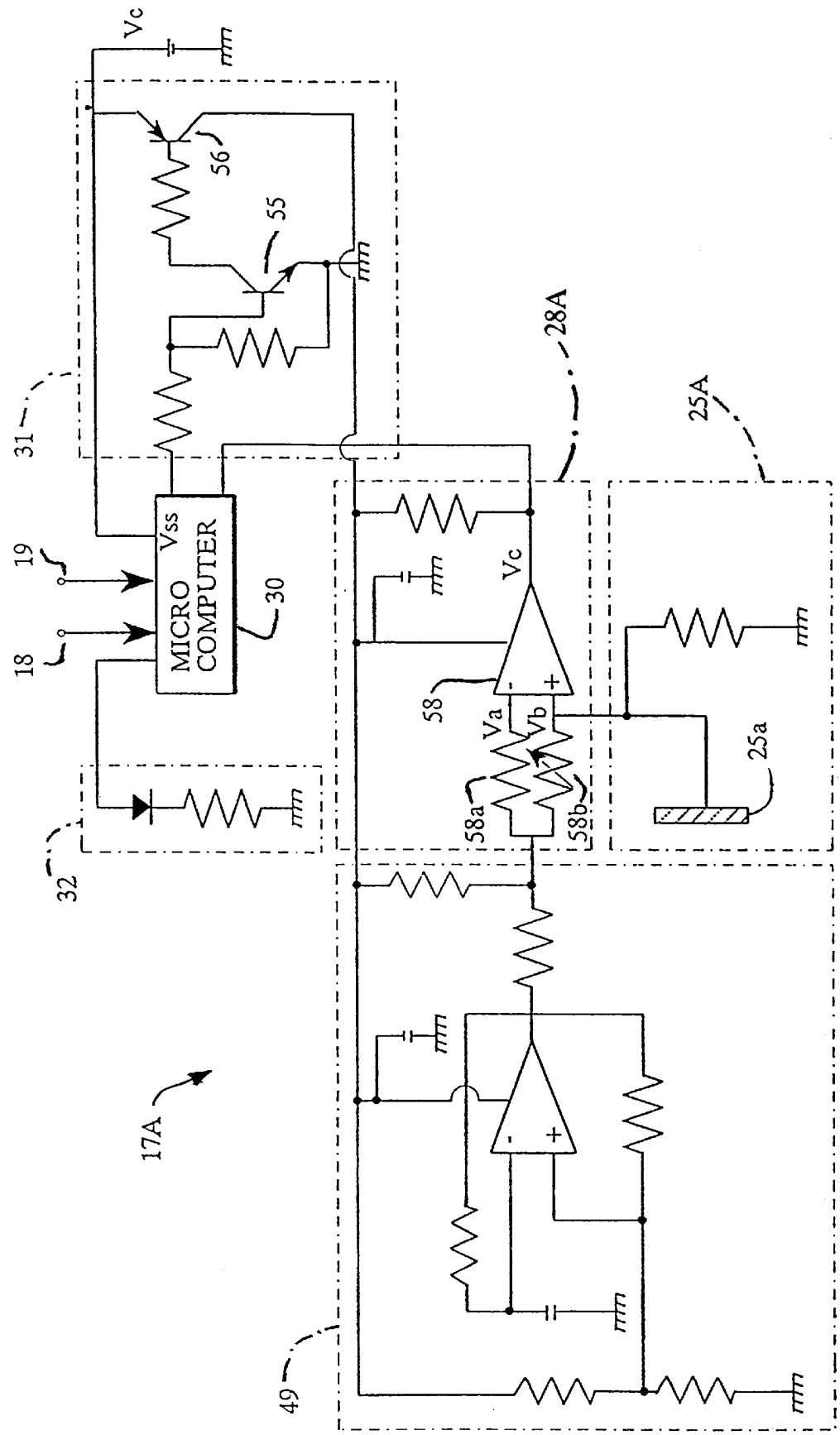
FIG. 8 is a circuit diagram of the window impediment warning system, of FIG. 6.

Referring to FIGS. 7 and 8, the impediment warning system 17A is comprised of a pulse generator 49, a detection circuit 28A, to which both touch sensor 25A and pulse generator 49 are electrically connected, a switching circuit 31, a microcomputer 30 and a warning device 32. The pulse generator 49, which provides a high frequency pulse signal, may be of any type comprised of resistances, condensers and an operational amplifier well known to those skilled in the art. The switching circuit 31 includes two transistors 55 and 56 arranged such that the transistor 55 is turned conductive upon receipt of a base current, causing the transistor 56 to turn conductive as well. Consequently, both pulse generator 49 and phase shift detection circuit 28A are supplied with battery power so as to be activated. The microcomputer 30 provides a base current for the transistor 55 only when the automatic exposure control system measures the brightness of a target subject lower than a brightness predetermined for automatic flash photography.

The detection circuit 28A includes a comparator 58. The high frequency pulse signal (V) from the pulse generator 49 is divided into two input pulse signals (Va, Vb) and one of the two input pulse signal is inverted. The comparator 58 receives the inverted pulse signal as a reference signal at one input terminal (−) through a resistance 58a and the not-inverted pulse signal as an object pulse signal at another input terminal (+) connected to the touch sensor 25A through a variable resistance 58b. For the object pulse signal (Vb), a delay circuit, such as a CR circuit, is configured by the variable resistance 58b and an electrostatic capacitance created between the touch sensor 25A and the earth. Under proper holding conditions where a photographer's finger 67 does not touch the touch sensor 25A, these reference and object pulse signals Va and Vb are identical and accordingly, the potential at the two input terminals, is in equilibrium so that no output signal is provided by the comparator 58. On the other hand, under conditions where a photographer's finger 67 touches the touch sensor 25A (which are hereafter referred to as impeded holding conditions), an electrostatic capacitance is created between the touch sensor 25A and the earth, then, the equilibrium so far maintained between the input signals to the comparator 58 is lost. As a result, an output signal is provided by the comparator 58. Upon the occurrence of an output signal (Vc) at the output terminal of the comparator 58, the microcomputer 30 activates the warning device 32 to produce visible light or sound for warning. In this specification, touching a photographer's finger on a touch sensor of electrostatic capacity detection type includes a finger in the proximity of the touch sensor 25A so that equilibrium is lost between the input signals.

The impediment warning system 17A depicted in FIGS. 6–8 is similar in sequential operation to that of the previous embodiment with the exception that the decisions at S3 and S10 of the flow chart shown in FIG. 5 are made based on a current level across the current detection circuit 28 or on the occurrence of an output signal (Vc) from the detection circuit 28A, so that it need not be explained in sequential operation in detail therein.

In the impediment warning system 17A utilizing the electrostatic capacity detection type of touch sensor 25A, the detection of an electrostatic capacity depends upon the thickness of insulation t with which the conductive member 25a of the touch sensor 25A is mechanically isolated from a conductive material, such as a photographer's finger 67. In order to evaluate the performance of electrostatic capacity detection of the touch sensor 25A, the inventors of this application conducted experiments, in which an experimental circuit shown in FIG. 9 was utilized in place of the detection circuit 28A.

Figure 9:
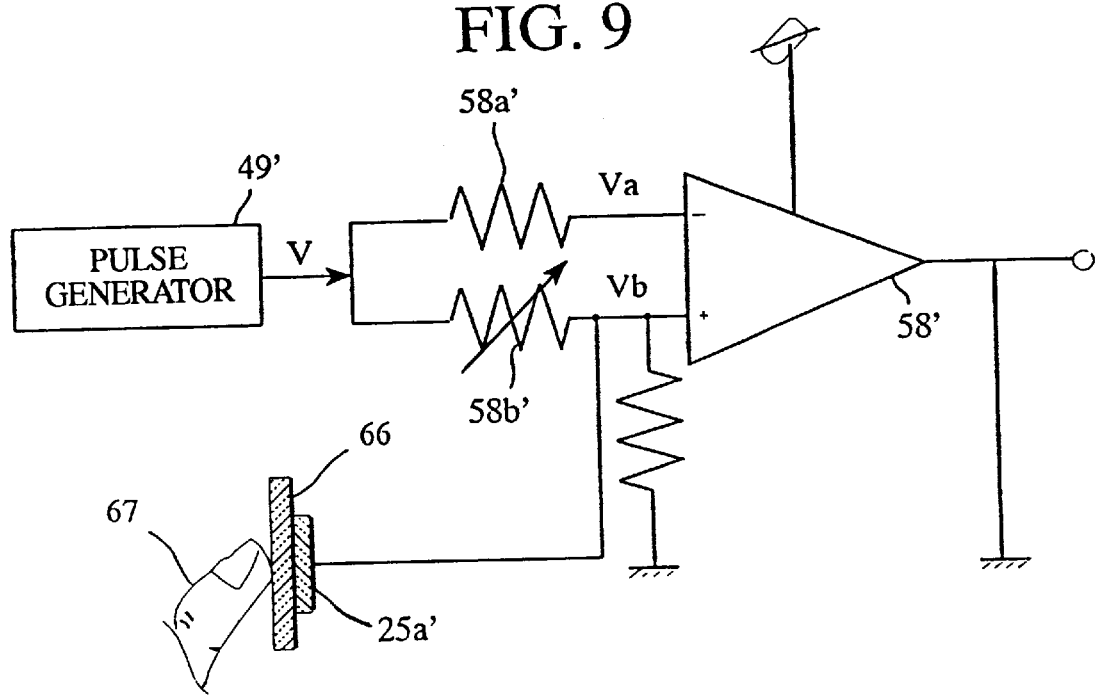
FIG. 9 is a diagram of an experimental circuit for examining the performance of window impediment detection of the window impediment warning system shown in FIG. 8.
Figure 10:
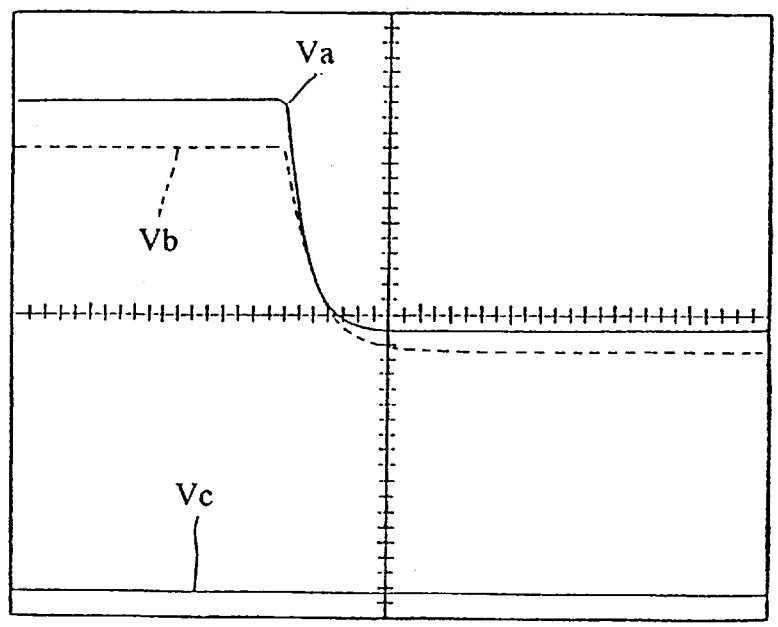
FIG. 10 is a wave form of an output signal of the experimental circuit of FIG. 9 is before detection of a window impediment detection.
Figure 11:
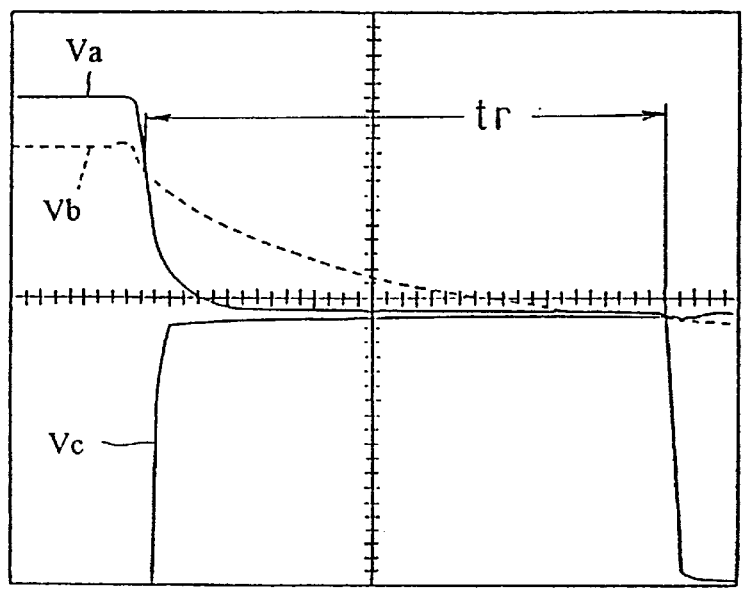
FIG. 11 is a wave form of an output signal of the experimental circuit of FIG. 9 after detection of a window impediment detection.

Referring to FIG. 9, the experimental circuit includes resistance between a high frequency pulse generator 49' and a comparator 58', namely a fixed resistance 58a' connected to the reference signal input terminal (−) and a variable resistance 58b' connected to the object signal input terminal (+). A conductive strip 25a' as the touch sensor 25A is connected to the object signal input terminal (+). The high frequency pulse signal (V) from the pulse generator 49' is divided into two pulse signals (Va, Vb) and one of which is inverted as a reference signal. The pulse generator 49' is adjusted to generate a high frequency pulse signal (V) of 100 KHz and the variable resistance is adjusted such that a potential difference is caused between the reference and object signals Va and Vb so as to maintain the reference signal (Va) to be higher in potential than the object signal (Vb) under proper holding conditions where the conductive strip 25a' is not touched by any conductive material, such as a photographer's finger 67, through an insulation cover plate 66, made of the same material as the transparent diffusion plate 23. Under these proper holding conditions, the comparator 58' provides an output signal Vc on a low level of potential close to zero volt as shown in FIG. 10. On the other hand, under impeded holding conditions where the conductive strip 25a' is not covered by the insulation cover plate 66 and is touched directly by a photographer's finger 67, the object pulse signal Vb falls sluggishly relative to the reference pulse signal Va and takes a time (which is hereafter referred to as an inversion time) tr until it becomes lower again than the reference pulse signal Va as shown in FIG. 11. This results from the creation of an electrostatic capacitance between the conductive strip 25a' and the earth. In other words, the object pulse signal Vb shifts in phase relative to the reference pulse signal Va. Accordingly, the output signal Vc from the comparator 58' results in an inversion in potential to a high level and has a shift in phase relative to an edge of the input pulse signals. In this manner, the comparator 58 develops a high level of an output signal Vc for a time equal to the inversion time tr as shown in FIG. 11. Because the duration time equal to the inversion time tr of the high level output signal Vc is proportional to a time constant CR of the delay circuit relating to the object pulse signal Va, if the variable resistance 58b' is fixed at a known resistance value, the photographer's electrostatic capacity is calculated based on these inversion time tr and resistance value. An increase in the inversion time tr makes it more easy to detect the output signal (Vc) from the detection circuit 28A.

Figure 12:
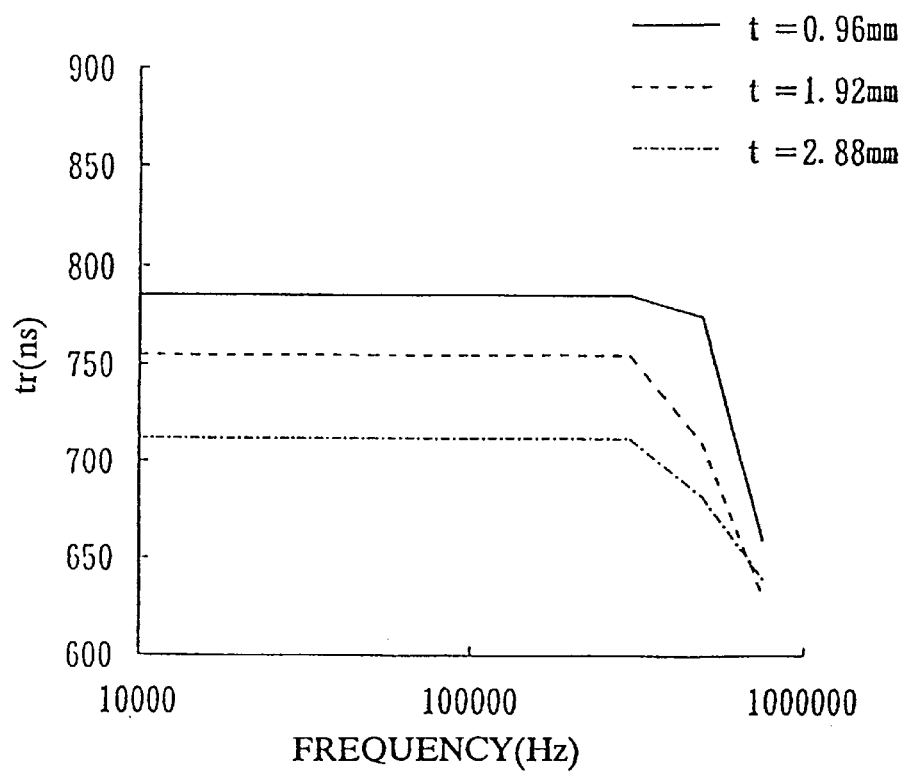
FIG. 12 is a graph showing the relationship of pulse falling time to frequency.
Figure 13:
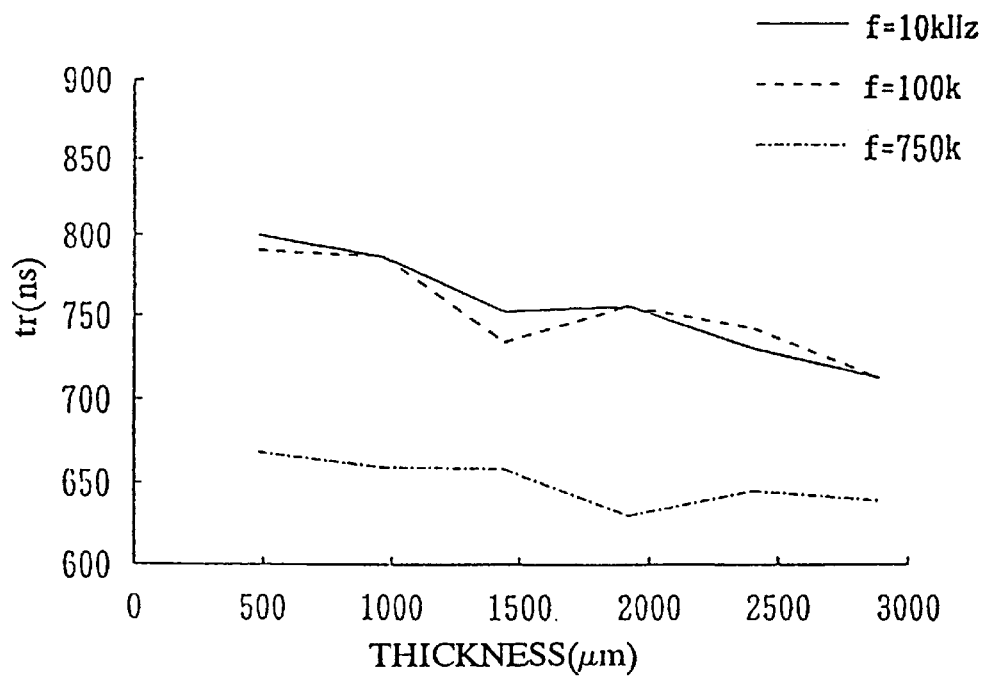
FIG. 13 is a graph showing the relationship of pulse falling time to thickness of an insulation plate.

Various thickness of insulation cover plates 66, made of the same material as the transparent diffusion plate 23, such as polyethylene terephthalate (PET), were prepared. In the experiments, the inversion times tr were measured for the insulation cover plates 66 having thicknesses of approximately 0.96 mm. 1.92 mm and 2.88 mm and pulse signals having frequencies of 10 KHz, 750 KHz and 100 KHz applied to the experimental phase shift detection circuit shown in FIG. 9. Results of the measurements, which are shown in FIGS. 12 and 13, reveal that there is no dependency of pulse falling time on frequency due to the fact that, whereas although, there are variations in the inversion time tr between approximately 630 and 800 nsec., as a matter of course, owing to magnitude of input pulses, nevertheless, the characteristic lines representing pulse falling times are similar in shape to one another. As is apparent in FIG. 12, each pulse exhibits a decline in pulse falling time at frequencies higher than approximately 500 KHz. This is because, the duration time of each pulse is less than 1,000 nsec. even if the pulse has a duty cycle of 50%.

Figure 14:
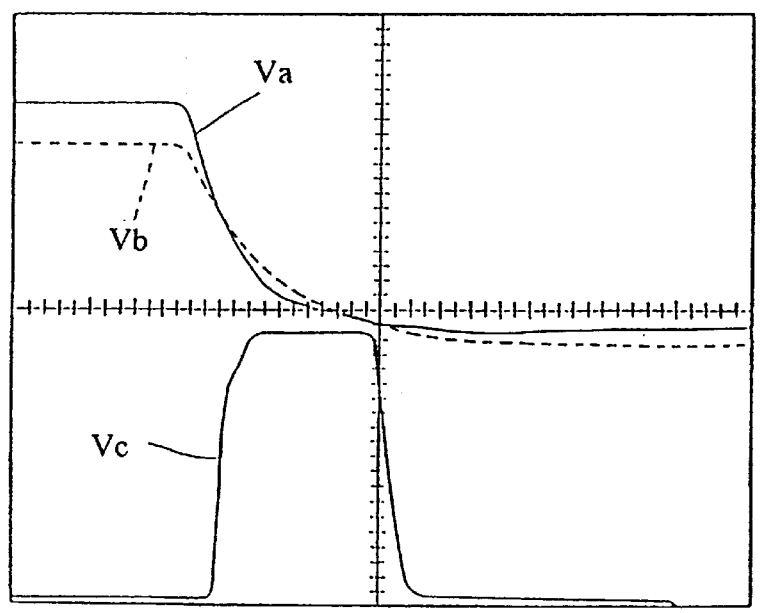
FIG. 14 is a wave form of an output signal of the experimental circuit of FIG. 9 which uses an insulation plate of a thickness of 0.96 mm.
Figure 15:
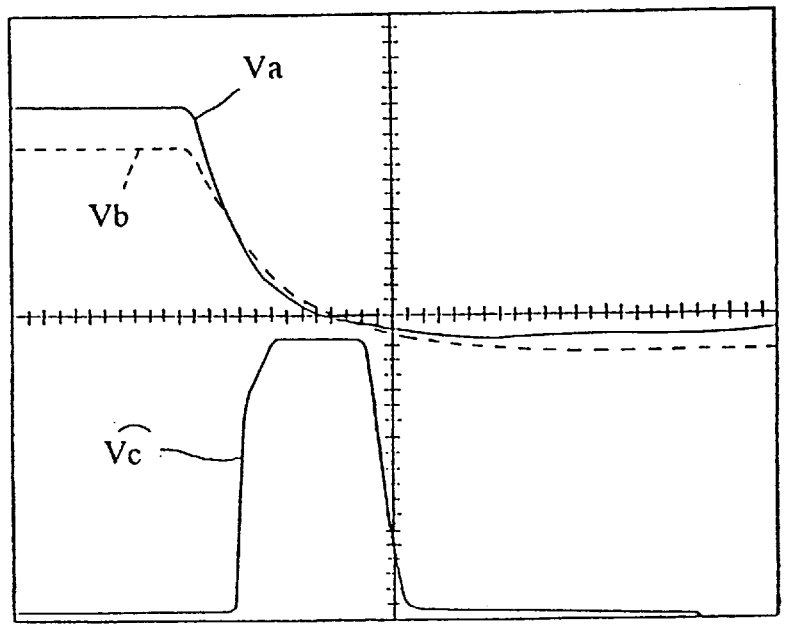
FIG. 15 is a wave form of an output signal of the experimental circuit of FIG. 9 which uses an insulation plate of a thickness of 1.92 mm.
Figure 16:
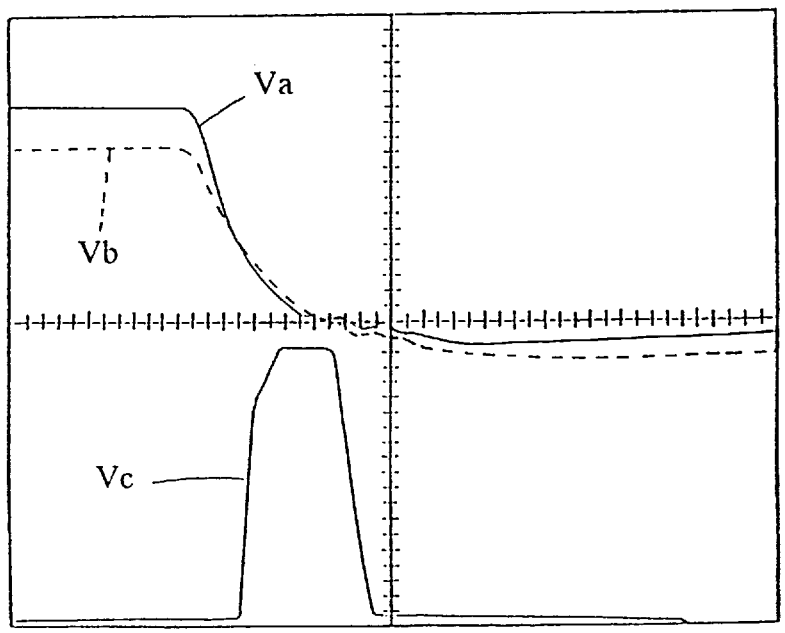
FIG. 16 is a wave form of an output signal of the experimental circuit of FIG. 9 which uses an insulation plate of a thickness of 2.88 mm.

FIGS. 14, 15 and 16 show wave forms of pulse signals (Va, Vb Vc) having a frequency of 100 KHz at input and output terminals for insulation cover plates 66 having thicknesses of approximately 0.96 mm. 1.92 mm and 2.88 mm, respectively. As clearly seen in these figures, the waves of the input pulse signals (Va, Vb) at the respective input terminals become closer in shape with an increase in thickness of the insulation cover plates 66 and, in addition, the inversion time tr of the output signal Vc becomes shorter. This fact reveals that it is preferred that the thickness of the insulation cover plates 66 be finely adjusted. The experiences proved that, whereas the greatest thickness of the insulation cover plate 66 which allows the detection of an electrostatic capacity of a photographer's finger 67 through the touch sensor is approximately 5 mm., nevertheless, it is preferred for accurate detection of an electrostatic capacity to use an insulation cover plate as thin as possible. As a result of having given consideration to the insulation cover plate as a part of the transparent diffusion plate 23 of the electronic flash unit 20 and the pulse signal in all its aspects, including the structural strength and formability of the plate and the accuracy of detection of an inversion time tr of the pulse signal, it is preferable to use a plate of a thickness of approximately between 1 and 2 mm. and a pulse having a frequency of approximately 100 Khz.

The conductive strip 25a for the touch sensor 25A may be replaced with a transparent conductive film or layer 70, as shown in FIG. 17, which may be a layer or a film of stannic oxide chemically formed on the back of a non-conductive transparent diffusion plate 23 or a layer or a film of indium-stannic oxide (ITO) deposited in vacuum evaporation on the back of a non-conductive transparent diffusion plate 23.

Figure 18:
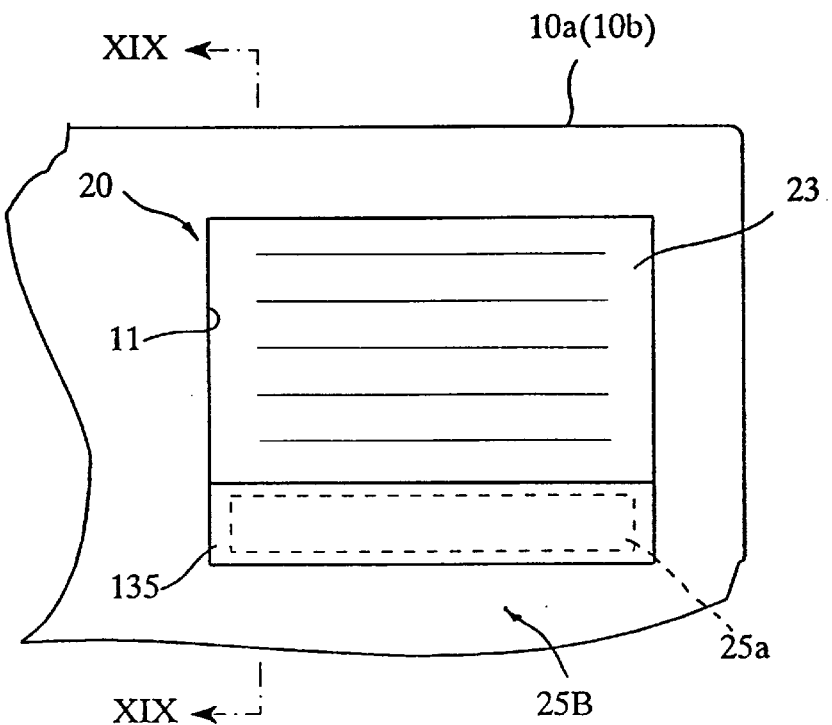
FIG. 18 is a front view of an essential part of a photographic camera with a window impediment warning system in accordance with a further another preferred embodiment of the present invention.
Figure 19:
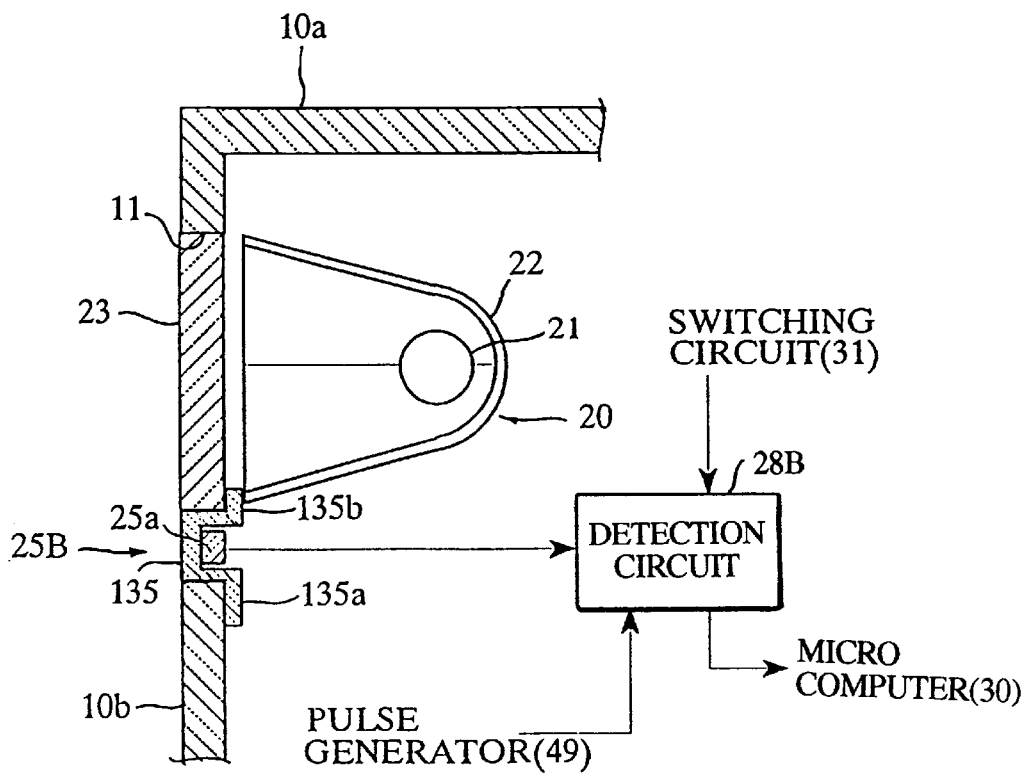
FIG. 19 is a cross-sectional view taken along line XIX—XIX of FIG. 18.

Referring to FIGS. 18 and 19, which show an essential part of the camera with an impediment warning system in accordance with another preferred embodiment of the present invention, the impediment warning system 17B includes a touch sensor 25B provided inside the camera body 10a and in close proximity to the lower side of a non-conductive transparent diffusion plate 23 of a built-in automatic electronic flash unit 20. In this instance, the camera body 10a is made of, or otherwise covered all over with a film of, a metal, such as aluminum, titanium, a nickel alloy and the like which are conductive materials, for a feeling of deluxe exterior appearance and improved durability. Specifically, the touch sensor 25B is comprised of an elongated conductive strip 25a and an insulation cover 135 which is flush with the transparent diffusion plate 23 and the camera body 10a and to which the conductive strip 25a is attached. The insulation cover 135 has a lower bent portion 135a secured to the back of the front wall 10b of the camera body 10a and an upper bent portion 135b secured to the lower sides of the transparent diffusion plate 23 and a reflector 22. Thus, the conductive strip 25a is perfectly insulated from the camera body 10a and an electronic flash unit 20. The impediment warning system 17B is generally similar in structure and operation to that shown in FIG. 7, excepting a detection circuit 28B as shown in FIG. 20. A high frequency pulse signal (V) from a pulse generator 49 is divided into two pulse signals, namely a reference pulse signal (Va) and an object pulse signal (Vb), by means of potential divider resistances R1–R4. The reference pulse signal (Va) is provided as an inverted pulse signal to one input terminal (–) of a comparator 58 through a resistance R6. Similarly, the object pulse signal (Vb), which is not inverted, is provided to another input terminal (+), of the comparator 58 through a resistance R5. The conductive strip 25a is electrically connected to the input terminal (+) and cooperates with the resistance R5 so as to form a CR circuit functioning as a delay circuit for the object pulse signal (Vb). On the other hand, an offset condenser 51 is connected to the input terminal (–) and cooperates with the resistance R6 so as to form a CR circuit functioning as a delay circuit for the reference pulse signal (Va). In this instance, since the touch sensor 25B, specifically the conductive strip 25a through the insulation cover 135, is in close proximity to the conductive camera body 10a, even when a photographer properly holds the camera body 10a, an electrostatic capacitance is created between the conductive strip 25a and the earth, so as to cause a phase shift, such as a time delay of pulse rise, of the object pulse signal (Vb). For this reason, these resistance R6 and offset condenser 51 are selected such that they have electrical characteristics that the object pulse signal (Vb) has the same delay in phase as, or otherwise has a delay in phase slightly larger than, the reference pulse signal (Va) when the photographer properly holds the camera body 10a. Accordingly, unless the photographer touches the touch sensor 25B, the object pulse signal (Vb) is not in any way delayed in phase relative to the reference pulse signal (Va), so as to be devoid of impediment warning. In order to prevent erroneous or inappropriate operation of the impediment warning system 17B due to electrical noise, the camera body 10a is made equal in potential to a ground level.

With the impediment warning system 17B, as long as the camera body 10a is not held by a photographer, the object pulse signal (Vb) is always ahead in phase relatively to the reference pulse signal (Va), so as to be always slightly higher in potential than the reference pulse signal (Va). The comparator 58 provides, on one hand, a high level of output signal (Vc) when the object pulse signal (Vb) is higher in potential than the reference pulse signal (va) and, on the other hand, a low level of output signal (Vc) when the object pulse signal (Vb) is lower in potential than the reference pulse signal (Va).

Figure 21:
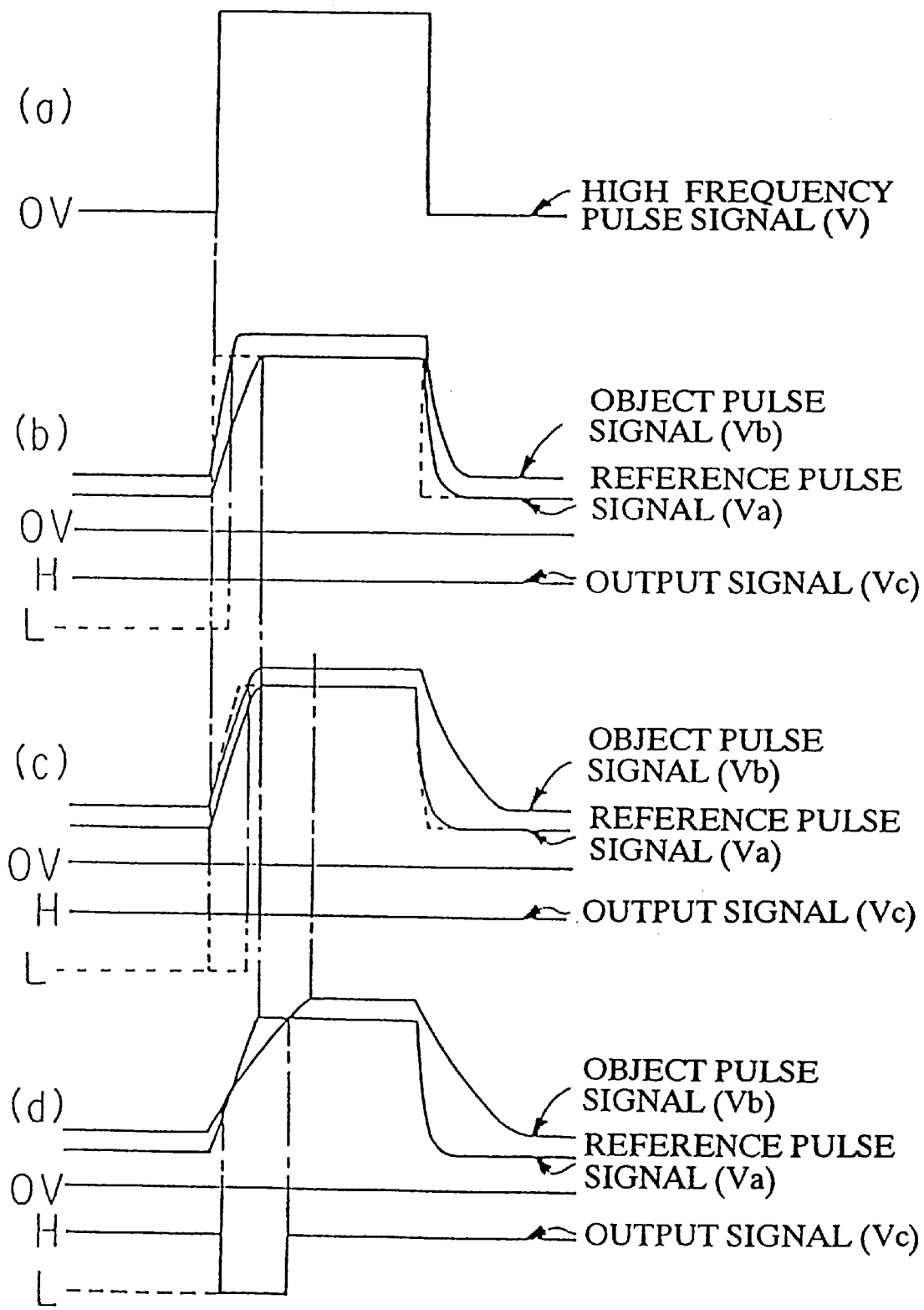
FIG. 21 is a wave form of an output of the phase difference detection circuit of FIG. 20.

In the operation of the impediment warning system 17B, when a photographer depresses the shutter release button 18 halfway, the pulse generator 49 generates a high frequency pulse signal, each pulse of which has a square wave having a sharp leading edge as shown by a wave form diagram (a) in FIG. 21. As was previously described, the high frequency pulse signal is divided into two pulse signals, i.e. a reference pulse signal (Va) and an object pulse signal (Vb). The reference pulse signal A is applied to the input terminal (–) through the resistance R6, and the object pulse signal (Vb) is applied to the input terminal (+) through the resistance R5.

If the camera 10 has been fixed onto a tripod and is not touched with photographer's fingers 67, the reference pulse signal (Va) and the object pulse signal (Vb) have square waves whose leading edges have became dull or sluggish as shown by a wave form diagram (b) in FIG. 21, so that each pulse is delayed in the time of rise to its peak potential with respect to the original pulse shown by the wave form diagram (a) in FIG. 21. This is because, a delay circuit, which is comprised of an intrinsic electrostatic capacity of the conductive strip 25a and the resistance R5, causes the leading edge of a square wave of the object pulse signal (Vb) to became dull or sluggish, providing a phase shift in rising to the peak potential. Similarly, a delay circuit, which is comprised of the offset condenser 51 and the resistance R6, causes the leading edge of a square wave of the reference pulse signal A to became dull or sluggish, providing a phase shift in rising to the peak potential. As was previously described, since the phase shift has been established larger for the reference pulse signal (va) than for the object pulse signal B, the object pulse signal (Vb) is maintained higher in potential than the reference pulse signal (Va). As a result, the comparator 58 provides a high level of output signal (Vc), so that the warning device 32 is not activated.

Figure 22A:
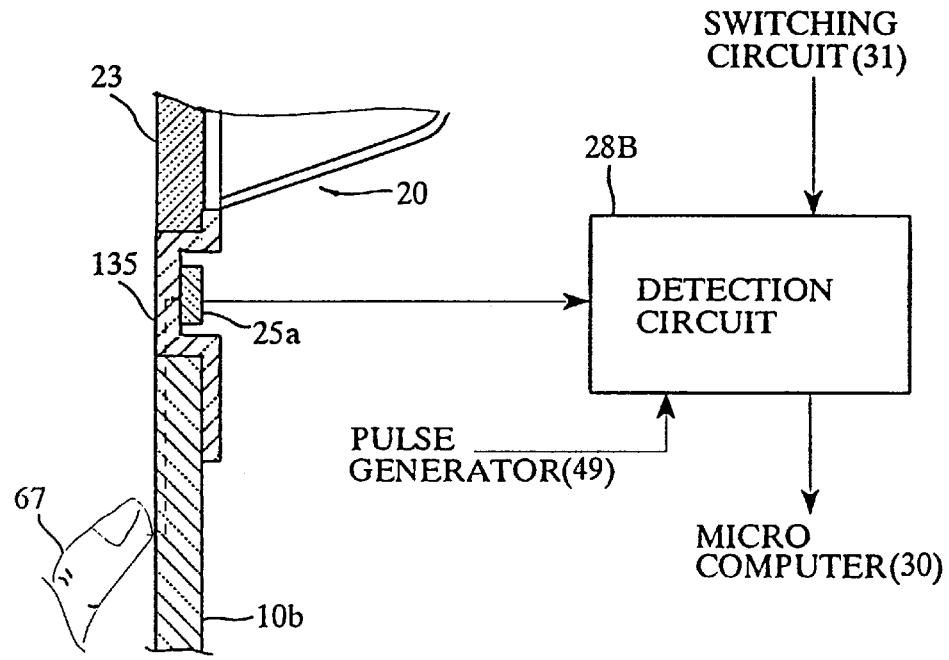
FIG. 22A and 22B are illustrations showing how the phase difference detection circuit of FIG. 20 detects an electrostatic capacity of a photographer.

As shown in FIG. 22A, even when the camera body 10a is held by a photographer without the portion where the conductive strip 25a is embedded touched by his or her fingers 67, an intrinsic electrostatic capacity of the photographer's finger 67 is imparted to the conductive strip 25a. In such a case, as shown by a wave form diagram (c) in FIG. 21, the object pulse signal (Vb) is further delayed in the time of rise to the peak potential with respect to that shown by the wave form diagram (b) in FIG. 21, and the reference pulse signal (Va) maintains the time of rise to the peak potential similar to that shown in the wave form diagram (b) in FIG. 21. While the object pulse signal (Vb) causes a phase shift, nevertheless, the object pulse signal (vb) is still ahead slightly in the phase of rise with respect to the reference pulse signal (Va), so that the object pulse signal (Vb) is still maintained higher in potential than the reference pulse signal (Va). As a result, the comparator 58 provides a high level of output signal (Vc), not activating the warning device 32.

Figure 22B:
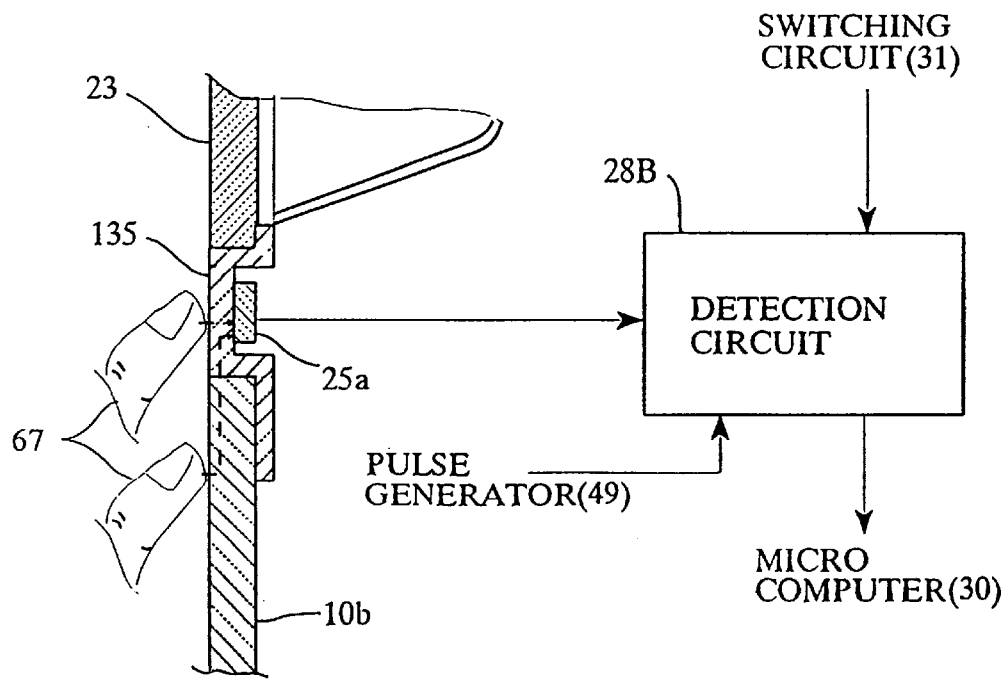

Under impeded holding conditions where a photographer's finger 67 touches the touch sensor 25B as shown in FIG. 22B, an intrinsic electrostatic capacity of the photographer's finger 67 is imparted to the conductive strip 25a not only directly through the insulation cover 135 but also indirectly through the insulation cover 135 via the camera body 10a. As a result, while the reference pulse signal (Va) does not shift the phase of rise, the object pulse signal (Vb) causes a further phase shift, so that there occurs a potential inversion between these reference and object pulse signals (Va and Vb). That is, the reference object signal (Va) becomes higher in potential than the object pulse signal (Vb). Then, the comparator 58 provides a low level of output signal (Vc), activating the warning device 32 while the potential inversion is sustained.

In this instance, if there were not provided the offset condenser 51, under proper holding conditions where the conductive strip 25a is not touched even indirectly by the photographer's fingers 67 through the insulation cover 135, the object pulse signal (Vb) does not cause any phase shift with respect to the original pulse as indicated by a broken line in the wave form diagram (b) in FIG. 21. Consequently, even when the camera body 10a is properly held by the photographer, only the reference pulse signal (Va) is advanced in the time of rise to the peak potential, so that the reference pulse signal (Va) becomes higher in potential than the object pulse signal (Vb). This forces the comparator 58 to provide a high level of output signal (Vc), resulting in inappropriate activation of the warning device 32. Further, it is deficient to simply select the resistance R6 and the offset condenser 51 which have electrical characteristics to countervail a phase shift of the object pulse signal (Vb) occurring when the camera body 10a is not touched by any conductive material, such as photographer's fingers 67. This is because the object pulse signal (Vb) is advanced in the time of rise to the peak potential with respect to the reference pulse signal (Va) even under proper holding conditions as shown by a broken line in the wave form diagram (c) in FIG. 21. This compels the reference pulse signal to be higher in potential than the object pulse signal, leading to inappropriate activation of the warning device 32 as well as there is not provided the offset condenser 51.

Figure 23:
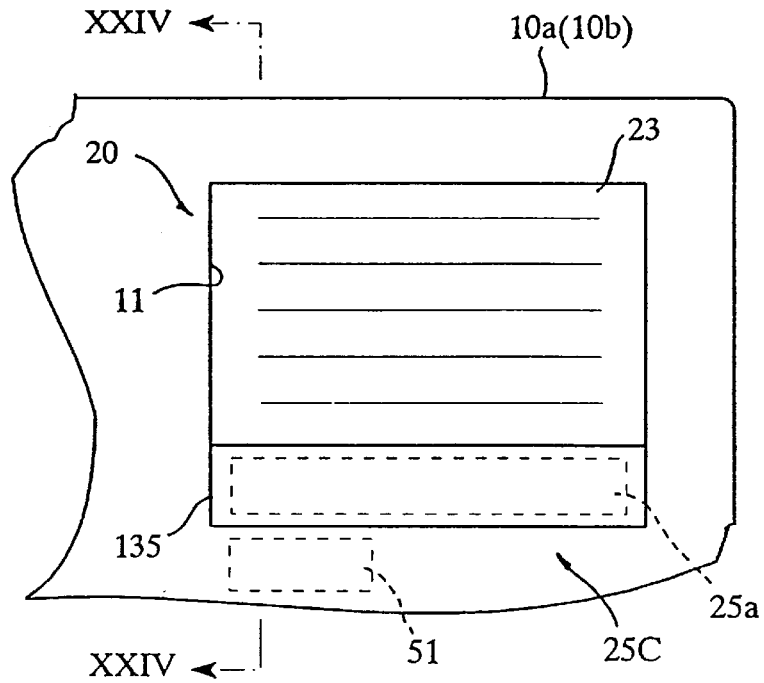
FIG. 23 is a front view of an essential part of a photographic camera with a window impediment warning system in accordance with yet a farther preferred embodiment of the present invention.
Figure 24:
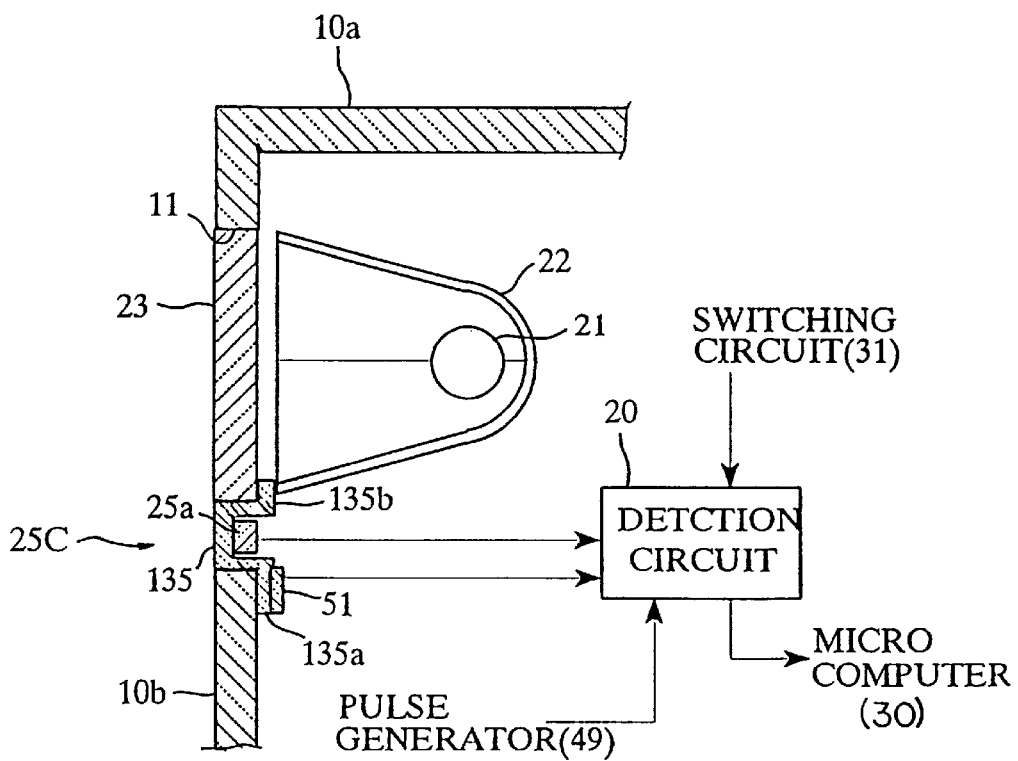
FIG. 24 is a cross-sectional view taken along line XXIV—XXIV of FIG. 23.

Referring to FIGS. 23 and 24, an essential part of the camera with an impediment warning system 17C in accordance with another preferred embodiment of the present invention is shown, which prevents inappropriate activation of a warning device under normal holding conditions. The impediment warning system 17C includes a touch sensor 25C comprised of, in addition to an elongated conductive strip 25a and an insulation cover 135, an offset or correction conductive member 51' secured to a lower bent portion 135a of an insulation cover 135 and electrically connected to an input terminal (−) for a reference pulse signal (Va) of a comparator 58 contained in a detection circuit 28C.

An intrinsic electrostatic capacity of a conductive material, such as an electrostatic body capacity of a photographer's finger 67, is imparted to the offset conductive member 51', on one hand, indirectly through the insulation cover 135 via the camera body 10a under proper holding conditions and, on the other hand, directly through the insulation cover 135 in addition to indirectly through the insulation cover 135 via the camera body 10a under impeded holding conditions. Due to the fact that the imparted electrostatic capacity is in inverse proportion to the distance of the offset conductive member 51' from where a photographer's finger 67 touches the camera body 10a, the offset conductive member 51' is selected in location so as to be imparted through the insulation cover 135 via the camera body 10a, under proper holding conditions on one hand, with an electrostatic capacity equal to, or slightly larger than, that the conductive strip 25a under the same holding condition and, on the other hand, under impeded holding conditions, with an electrostatic capacity sufficiently smaller than that the conductive strip 25a under the same holding condition.

Specifically describing the location of the offset conductive member 51', it is located such that the shortest path of static electricity from the front surface of the insulation cover 135 is longer to the offset conductive member 51' than to the conductive strip 25a. With this configuration, the offset conductive member 51' is always imparted with an electrostatic body capacity of a photographer's finger 67 smaller than the conductive strip 25a when any part of the insulation cover 135 is touched by a photographer's finger 67. In addition, the offset conductive member 51' is located such that the shortest path of static electricity from the front wall 10b of the camera body 10a is shorter to the offset conductive member 51' than to the conductive strip 25a. With this configuration, an electrostatic body capacity of a photographer's finger 67 is imparted equally to both conductive strip 25a and offset conductive member 51' or slightly less to the conductive strip 25a than to the offset conductive member 51'.

Figure 25:
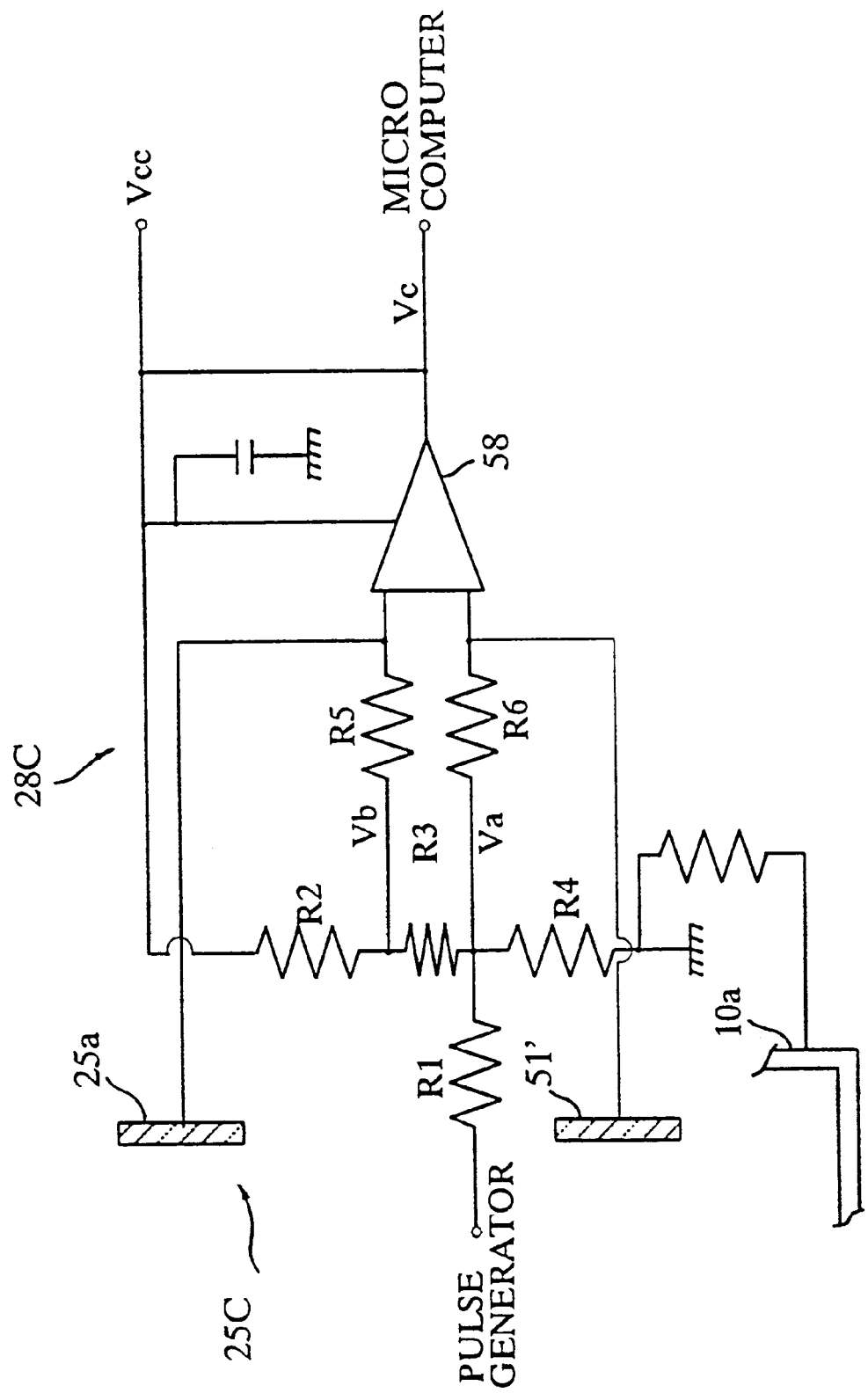
FIG. 25 is a diagram showing a phase difference detection circuit of the window impediment warning system of FIG. 23.

Referring to FIG. 25, which shows a phase shift detection circuit 28C similar to that of the previous embodiment, except the offset conductive member 51' which replaces the offset condenser 51, a high frequency pulse signal from a pulse generator 49 is divided into reference and object pulse signals (Va and Vb), by means of potential divider resistances R1–R4. The reference pulse signal (Va) is provided as an inverted pulse signal to one input terminal (−) of the comparator 58 through a resistance R6. Similarly, the object pulse signal (Vb), which is not inverted, is provided to another input terminal (+), of the comparator 58 through a resistance R5. The conductive strip 25a is electrically connected to the input terminal (+) and cooperates with the resistance R5 so as to form a CR circuit functioning as a delay circuit for the object pulse signal (Vb). Similarly, the offset conductive member 51' is electrically connected to the input terminal (−) and cooperates with the resistance R6 so as to form a CR circuit functioning as a delay circuit for the reference pulse signal (Va). These resistances R5 and R6 are selected in consideration of an electrostatic capacity of the conductive members 25a and 51' such that they have electrical characteristics, such as resistance, with which a time of pulse rise is equal between the reference and object pulse signals V(a) and (Vb), or otherwise slightly larger for the reference pulse signal (Va) than for the object pulse signal (Vb), so as thereby to compel the object pulse signal (Vb) to be always slightly higher in potential than the reference pulse signal (Va) whenever it is ahead in phase of the reference pulse signal (Va).

Figure 26:
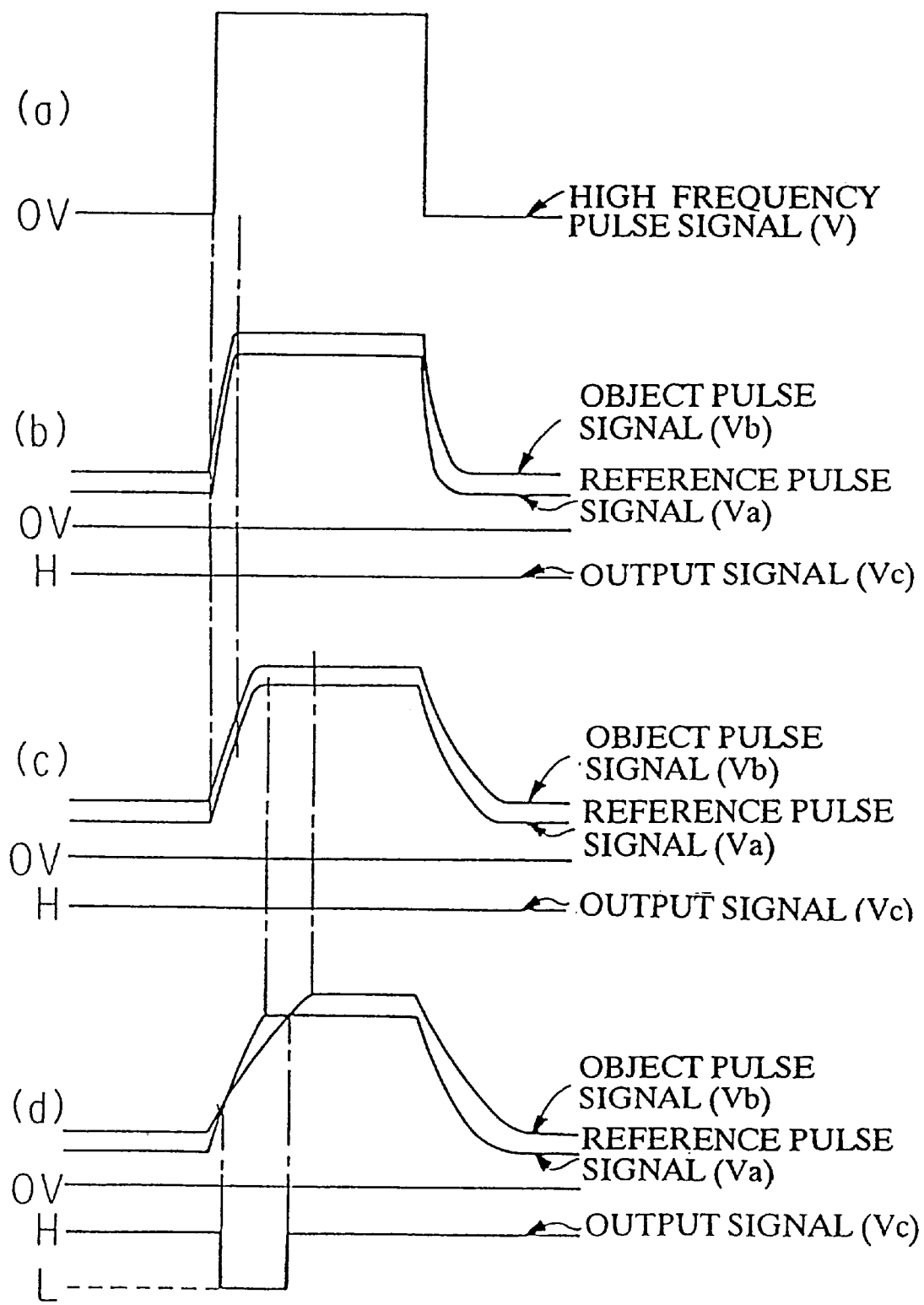
FIG. 26 is a wave form of an output of the phase difference detection circuit of FIG. 25.

With the impediment warning system 17C, upon an occurrence of a half depression signal, the microcomputer 30 causes a switching circuit 31 to activate both pulse generator 49 and detection circuit 28C, generating a high frequency pulse signal containing sharp-edged, square wave pulse (V) as shown in a wave form diagram (a) in FIG. 26. This pulse signal is divided into two, namely an inverted reference pulse signal (Va) and an object pulse signal (Vb), by means of potential divider resistances R1–R4, which are provided to input terminals (−) and (+) of the comparator 58 through the resistances R6 and R6, respectively. If the camera body 10a is not touched by any conductive material, such as photographer's fingers 67, both the reference pulse signal (Va) and the object pulse signal (Vb) have square wave forms with leading edges slightly made dull or sluggish as shown in a wave form diagram (b) in FIG. 26. Further, the object pulse signal (Vb) is, on one hand, ahead in phase of the reference pulse signal (Va) and, on the other hand, maintained higher in potential than the reference pulse signal (Va). This is because the delay circuit, which is comprised of an intrinsic electrostatic capacity to the conductive strip 25a and the resistance R5, causes the leading edge of the square wave of the object pulse signal (Vb) to became dull or sluggish, providing a phase of pulse rise to the peak potential. Similarly, the delay circuit, which is comprised of the offset conductive member 51' and the resistance R6, causes the leading edge of a square wave of the reference pulse signal (Va) to became dull or sluggish, providing a phase of pulse rise to the peak potential. As a result, the object pulse signal (Vb) is maintained higher in potential than the reference pulse signal (Va), causing the comparator 58 to provide a high level of output signal (Vc) so as thereby to leave the warning device 32 deactivated or turned off.

Figure 27A:
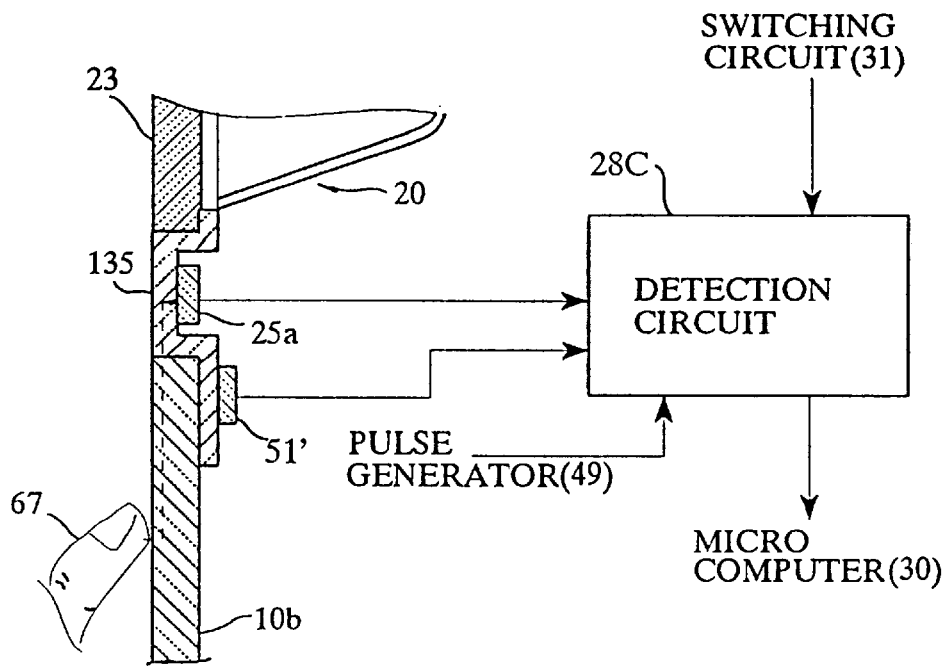
FIGS. 27A and 27B are illustrations showing how the phase difference detection circuit of FIG. 25 detects an electrostatic capacity of a photographer.

Under proper holding conditions where the camera body 10a is held by a photographer without the conductive member 25a and 51' touched indirectly through the insulation cover 135 and through both insulation cover 135 and camera body 10a, respectively, by the photographer's finger 67 as shown in FIG. 27A, an intrinsic electrostatic capacity to the photographer is imparted to both conductive members 25a and 51'. In such a case, as shown in a wave form diagram (c) in FIG. 26, while both reference and object pulse signals (Va and Vb) cause further phase shifts, nevertheless the object pulse signal (Vb) is still ahead slightly of the reference pulse signal (Va), the object pulse signal (Vb) is still maintained to be higher in potential than the reference pulse signal (Va). This is because an electrostatic capacity is imparted almost equally to both conductive members 25a and 51'. Consequently, the comparator 58 provides a high level of output signal (Vc) so as thereby to leave the warning device 32 deactivated or turned off.

Figure 27B:
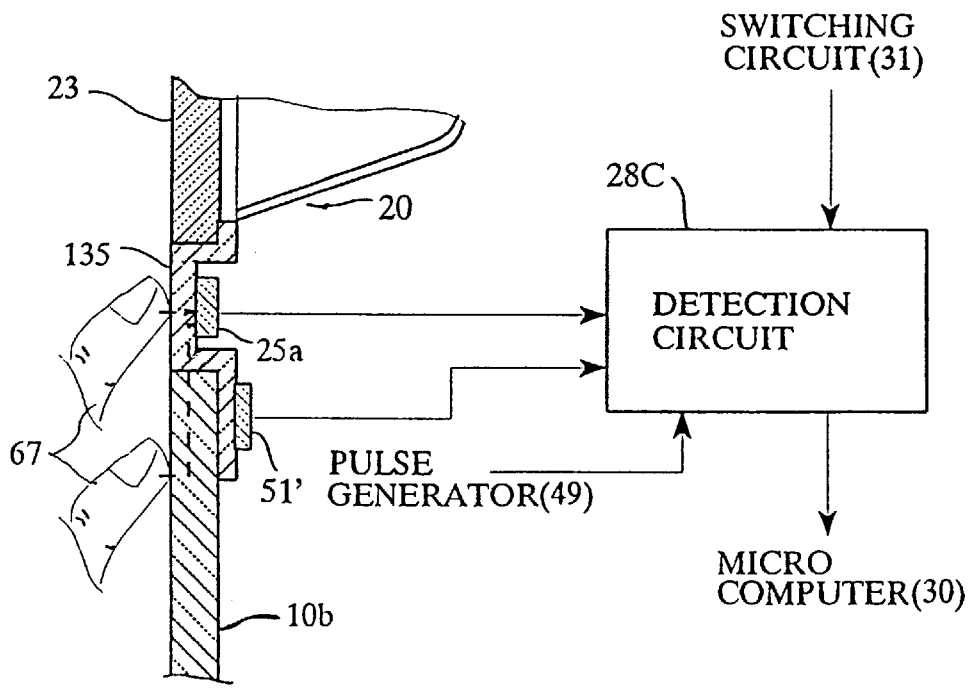
Figure 28:
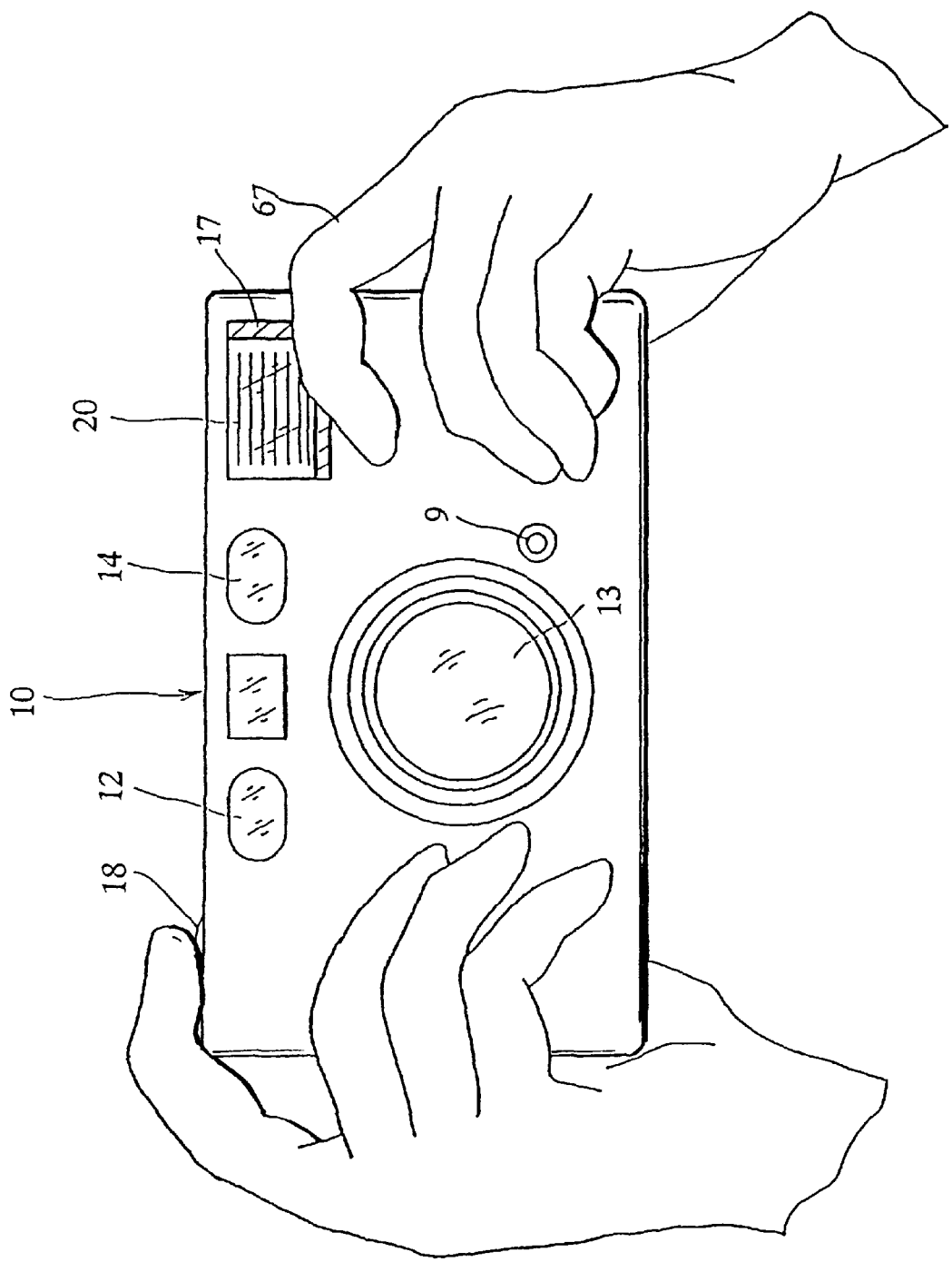
FIG. 28 is a front view of a camera with an electronic flash window impeded partly by photographer's finger.

Under impeded holding conditions where a photographer's finger 67 touches the touch sensor 25C, an intrinsic electrostatic capacity to the photographer's finger 67 is imparted to both conductive members 25a and 51' not only directly through the insulation cover 135 and also indirectly through the insulation cover 135 via the camera body 10a as shown in FIG. 27B. Because the electrostatic capacity, which is imparted to both conductive members 25a and 51' and suffers the sluggishness of the pulse signals (Va and Vb), is sufficiently larger where the path of static electricity does not include any part of the camera body 10a than where it includes a part of the camera body 10a, a phase shift, which is caused due simply to the electrostatic capacity imparted through any part of the camera body 10a, has no dominant consequence to the potential inversion. Further, because the shortest path of static electricity is always longer between the insulation cover 135 and the conductive strip 25a than between the insulation cover 135 and the offset conductive member 51' always when any part of the insulation cover 135 is touched by a photographic finger 67, an electrostatic capacity is imparted more to the conductive strip 25a than to the offset conductive member 51'. This results in a potential inversion between these reference and object pulse signals (Va) and (Vb). That is, the reference signal (Va) becomes higher in potential than the object pulse signal(Vb) as shown in a wave form diagram (d) in FIG. 26. Then, the comparator 58 provides a high level of output signal (Vc), activating the warning device 32 for a period of sustenance of the potential inversion.

The provision of such an offset conductive member 51' prevents the impediment warning system 17C from providing an inappropriate impediment warning. Since the phase shift of a reference pulse signal (Va) can be appropriately varied according to location and size of the offset conductive member 51', the circuit may be designed increased degrees of freedom. Electrostatic capacity of the offset conductive member 51' and an electrostatic capacity imparted to the offset conductive member 51' are free from any change due to temperature, the impediment warning system 17C is more easily adaptable to changes of circumstances than that having the offset condenser 51.

Whereas, the impediment warning system 17C has been described as incorporated within the camera body 10a made of a conductive material, or otherwise covered all over with a thin material of a conductive material, nevertheless, it may be incorporated within a camera body 10a made of a conductive material covered all over with a thin material of a non-conductive material. Even though a die casted aluminum camera body, which is conductive, is covered with the non-conductive cover material and if it has various metal parts and metal screws exposing to the exterior, touching these metal parts and metal screws with photographer's fingers is comparable to holding directly the die casted camera body and consequently results in imparting both electrostatic capacities of the electrically conductive segment of the touch sensor and the photographer to the circuit. This leads to an inappropriate window impediment warning. Even in such a case, the impediment warning system 17C of the present invention prevents such an inappropriate window impediment warning.

The warning device of any impediment warning system described above may be a light emitting diode (LED) disposed within the view finder behind the finder window, or otherwise an artificial sound generating element disposed anywhere inside the camera body. The utilization of both light emitting diode and artificial sound generating element provides for optimum warning not only in bright circumstances but also in noisy circumstances.

As was previously described, in the case that an exposure is allowed to be intentionally made even when the flash window 11 is impeded by the photographer's finger, it is desired, but not essential, to cause the impediment warning system 17C to provide an impediment warning for a predetermined period of time. Otherwise, if it is always preferable to prevent unsuccessful pictures, the shutter release button 18 may be locked so as to prohibit an exposure accompanying with an impediment warning.

While the touch sensor has been presented in connection with a flash window as an exemplar, nevertheless, it may be provided in connection with and in close proximity to any lighting window of an automatic camera control system inside the camera body, such as the taking lens, the light windows of the active type automatic focusing system, the light window of the automatic exposure control system, and the finder window, through which light emanating from or traveling to the automatic camera control system passes.

The conductive material of each of the touch sensors 25 and 25A–25C, and, if necessary, their insulating covers, may be disposed on at least one side of the flash window 11 where a photographer's finger is most likely to touch the flash window 11, or otherwise along adjacent two or four sides of the flash window 11. Further, the conductive material of each of the touch sensor 25 and 25A–25C may be a transparent conductive film or layer chemically formed on the back of the diffusion plate or deposited in vacuum evaporation on the back of the transparent window shield of the diffusion plate 23, the light window 12 or 14 of the active type automatic focusing system, or the light window of the automatic exposure control system. The insulating cover members may be formed integrally with the reflector of the flash window 11. Such a transparent conductive film or layer allows the touch sensor to be placed inside the camera body, so as to provide a simple and plain appearance, thereby increasing the degree of freedom of camera design.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A photographic camera comprising:
    a camera body having an outer surface formed by an electrically conductive material, said camera body being provided with a window in a front wall through which light passes;
    a primary electrically conductive segment disposed in close proximity to said window so as to be touched by a photographer's finger when said photographer's finger impedes said window at least partially and electrically isolated from said camera body;
    an insulation cover for covering said primary electrically conductive segment and for insulating said primary electrically conductive segment from said outer surface of said camera body;
    an auxiliary electrically conductive segment separated from said primary electrically conductive segment and electrically insulated from said primary electrically conductive segment and said camera body;
    an electric circuit disposed inside said camera body and electrically connected to said primary electrically conductive segment and said auxiliary electrically conductive segment for providing an output in response to a difference between an electrostatic body capacity of said photographer's fingers sensed by said primary electrically conductive segment through said insulation cover and an electrostatic body capacity of said photographer's fingers sensed by said auxiliary electrically conductive segment through said camera body; and
    a warning device actuated by said output of said electric circuit to give the photographer a warning that said window is impeded by said photographer's fingers.

2. The photographic camera as defined in claim 1, wherein said auxiliary electrically conductive segment is attached to and insulated from said camera body through said insulation cover.

3. The photographic camera as defined in claim 1, wherein said electric circuit includes a pulse generator for generating a high frequency pulse signal and a comparator having both input ends thereof connected to said high frequency pulse signal, one of said input ends being further connected to said primary electrically conductive segment and the other of said input ends being connected to said auxiliary electrically conductive segment, for comparing potential levels of said high frequency pulse signals at said both input ends, and wherein said electric circuit detects said difference in electrostatic body capacity based on a reversal of an output of said comparator.

4. The photographic camera as defined in claim 1, wherein said auxiliary electrically conductive segment provides for said electric circuit an internal capacity greater than said primary electrically conductive segment while said camera body is separated from an external electrostatic capacity.

5. The camera of claim 1, wherein said auxiliary electrically conductive segment is spaced from the outer surface of the camera body by a distance that is different than a distance said primary electrically conductive segment is spaced from the outer surface.

6. A camera comprising:
    a body having an opening for passage of light therethrough;
    a non-electrically conductive transparent plate closing said opening and through which the light passes;
    a touch sensor integral with said transparent plate for sensing a touch of a finger on a portion of said transparent plate proximate said touch sensor;
    an electrical circuit within said body and electrically connected to said touch sensor for providing an output indicating that said portion of said transparent plate proximate said touch sensor has been touched, wherein an electrical characteristic of the touching finger causes an electrical parameter of said electrical circuit to change and wherein the change of the electrical parameter generates said output; and a warning device connected to said output for indicating that said portion of said transparent plate has been touched.

7. The camera of claim 6, wherein said touch sensor is attached to an interior surface of said plate.

8. The camera of claim 6, wherein said touch sensor is embedded within said plate.

9. The camera of claim 6, wherein the electrical parameter is an electrical potential in said circuit and wherein the touching finger shifts said potential between high and low.

10. The camera of claim 6, wherein said electrical circuit comprises a comparator and a pulse generator for providing a signal to both inputs of said comparator, one of said inputs being connected to said touch sensor so as to change the signal thereto from said pulse generator, said comparator for sensing the change and providing the output in response to the sensed change.

* * * * *